United States Patent
Tsai

(10) Patent No.: US 9,369,134 B2
(45) Date of Patent: Jun. 14, 2016

(54) PLL WITH ACROSS-STAGE CONTROLLED DCO

(71) Applicant: TAIWAN SEMICONDUCTOR MANUFACTURING COMPANY LTD., Hsinchu (TW)

(72) Inventor: Tsung-Hsien Tsai, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/484,779

(22) Filed: Sep. 12, 2014

(65) Prior Publication Data

US 2015/0311902 A1 Oct. 29, 2015

Related U.S. Application Data

(63) Continuation-in-part of application No. 14/261,467, filed on Apr. 25, 2014.

(51) Int. Cl.
*H03L 1/00* (2006.01)
*H03L 7/099* (2006.01)
*H03L 7/08* (2006.01)

(52) U.S. Cl.
CPC ............... *H03L 1/00* (2013.01); *H03L 7/0802* (2013.01); *H03L 7/0992* (2013.01)

(58) Field of Classification Search
CPC ............. H03L 7/099; H03L 7/18; H03L 7/10; H03L 7/091; H03L 7/089; H03L 7/113; H03L 7/02
USPC .......... 327/147, 156, 158, 161; 375/371, 373, 375/375, 376
See application file for complete search history.

(56) References Cited

U.S. PATENT DOCUMENTS

2008/0094147 A1*  4/2008  Olsson ................. H03L 7/0991
                                                    331/1 A

* cited by examiner

*Primary Examiner* — John Poos
(74) *Attorney, Agent, or Firm* — WPAT, P.C., Intellectual Property Attorneys; Anthony King

(57) ABSTRACT

In some embodiments, a PLL comprises an across-stage DCO controller and a DCO. The across-stage DCO controller comprises a first detector and a second tuning code adjustor. The first detector receives a first tuning code in a current stage in which an output frequency of the DCO is tuned by a first step size and generates a first detect signal which indicates whether the first tuning code exceeds a first range that the DCO can be correspondingly tuned in the current stage. The second tuning code adjustor adjusts a second tuning code from a previous stage in which the output frequency of the DCO is tuned by a second step size in response to the first detect signal. The second step size is larger than the first step size. The DCO generates the output frequency in response to codes comprising the adjusted second tuning code.

20 Claims, 18 Drawing Sheets

PLL WITH ACROSS-STAGE CONTROLLED DCO

PRIORITY CLAIM AND CROSS-REFERENCE

This application is a Continuation-in-Part (CIP) application of U.S. application Ser. No. 14/261,467 filed on Apr. 25, 2014, entitled "ALL-DIGITAL PHASE-LOCKED LOOP (ADPLL)", the disclosure of which is hereby incorporated by reference in its entirety.

BACKGROUND

Phase locked loop (PLL) is an important component in communication. The PLL outputs an oscillator signal that is stabilized, i.e. locked, with respect to a phase and a frequency of an input reference signal. Nowadays, all-digital PLL (AD-PLL) has been researched and developed to replace analog PLL because ADPLL is free from large analog loop filters and passive elements, and has much lower parameter variability and a fast design turn-around cycle using automated computer aided design (CAD) tools. Among the digital components of the ADPLL, a digital-controlled oscillator (DCO) is a block that actually generates the oscillator signal in response to control blocks in the ADPLL. To facilitate locking of the ADPLL, the DCO is divided into stages such that a frequency of the oscillator signal can be tuned by different step sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
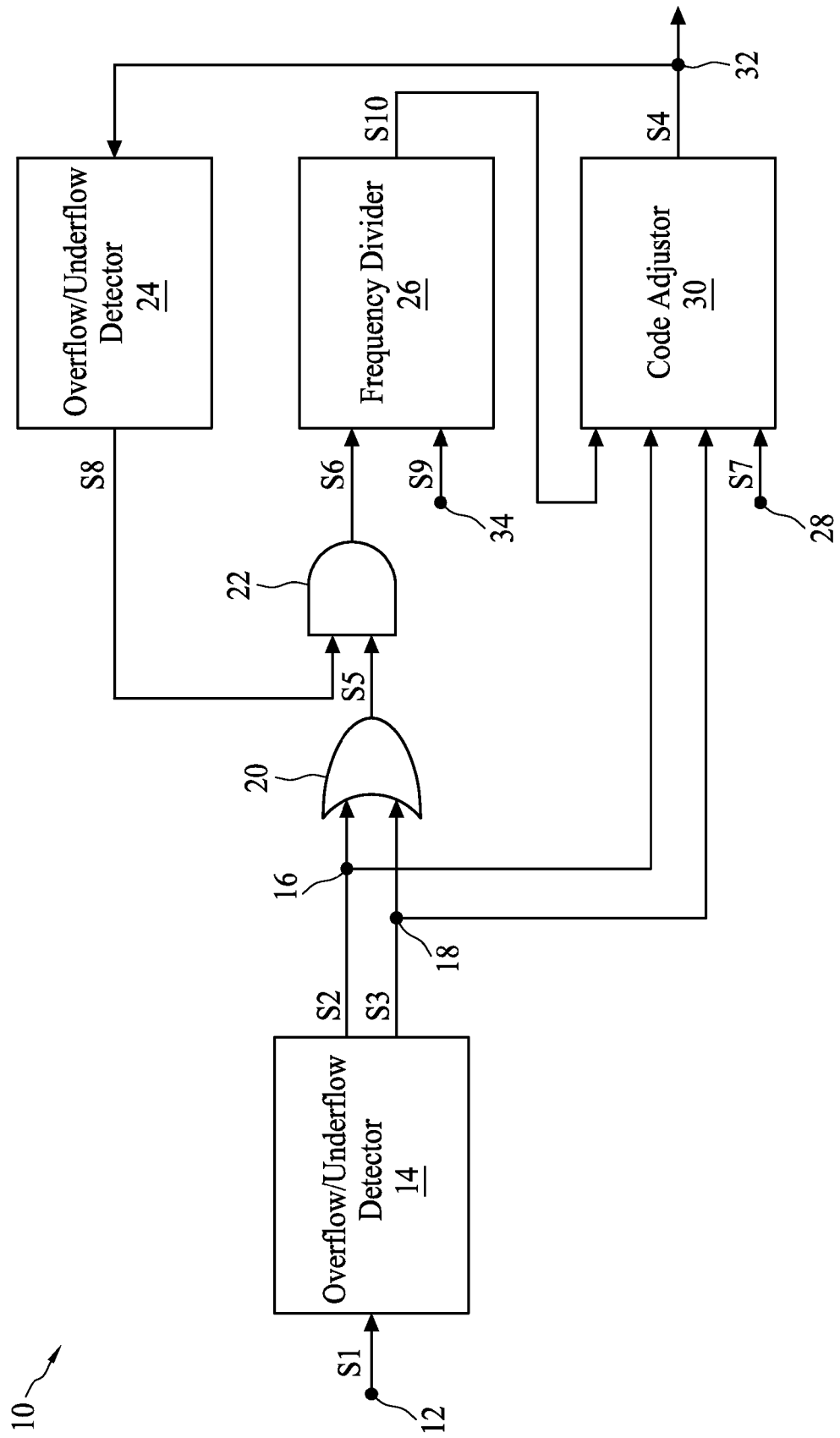
FIG. 1 is an illustration of a hardware block diagram, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present. In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device. An active edge of a clock signal can either be a positive edge or a negative edge.

ADPLL With Overflow/Underflow Responsive Code Adjustor

FIG. 1 illustrates a hardware-block diagram representing a portion of the ADPLL 10 in accordance with some embodiments. In some embodiments, the hardware-block diagram 10 comprises a first node 12, a second node 16, a third node 18, a fourth node 34, a fifth node 28, a sixth node 32, a first circuit 14, a second circuit 30, a third circuit 26, a fourth circuit 24, an or-gate 20 and an and-gate 22.

In some embodiments, the first circuit 14 is configured to receive a first signal 51 at the first node 12. In some embodiments, the first signal S1 comprises the code of fine-tuning. In some embodiments, the first circuit 14 is configured to output a second signal S2 at the second node 16 and a third signal S3 at a third node 18. In some embodiments, the first circuit 14 is configured such that the second signal S2 has a voltage within a first voltage range when the code of fine-tuning is equal to the first specified value. In some embodiments, the first voltage range comprises about 3V to about 5 V. In some embodiments, the first circuit 14 is configured such that the third signal S3 has a voltage within a second voltage range when the code of fine-tuning is equal to the second specified value. In some embodiments, the second voltage range comprises about 3V to about 5 V. In some embodiments, the or-gate 20 receives the second signal S2 and the third signal S3. In some embodiments, the or-gate 20 is configured to output a fifth signal S5 that is a disjunction of the second signal S2 and the third signal S3. In some embodiments, the and-gate 22 receives the fifth signal S5. In some embodiments, the and-gate 22 receives an eighth signal S8 outputted by the fourth circuit 24. In some embodiments, the and-gate 22 outputs a sixth signal S6 that is received by the third circuit 26. In some embodiments, the third circuit 26 receives a reference frequency signal S9 at the fourth node 34, and outputs a frequency divider signal S10 based upon the sixth signal S6 and the reference frequency signal S9. In some embodiments, a frequency of the frequency divider signal S10 is not greater than a PLL bandwidth of the system divided by 2. In some embodiments, the second circuit 30 receives the frequency divider signal S10, the second signal S2, the third signal S3 and a seventh signal S7. In some embodiments, the seventh signal S7 comprises an initial code of coarse-tuning. In some embodiments, the second circuit 30 is configured to output a fourth signal S4 at the sixth node 32. In some embodiments, the fourth signal S4 comprises the code of coarse-tuning. In some embodiments, the second circuit 30 is configured to increase or decrease the code of coarse-tuning, based upon the frequency divider signal S10, the second signal S2, the third signal S3 and the seventh signal S7. In some embodiments, the fourth circuit 24 is configured to receive the fourth signal S4. In some embodiments, the fourth circuit 24 is configured to output the eighth signal S8. In some embodiments, the fourth circuit 24 is configured such that the eighth signal S8 has a voltage within a third voltage range when the code of coarse-tuning is equal to the third specified value and when the code of coarse-tuning is equal to the fourth specified value. The eighth signal S8 has a voltage outside the third voltage range when the code of coarse-tuning is not equal to the third specified value and when the code of coarse-tuning is not equal to the fourth specified value. In some embodiments, the third voltage range comprises about 0V to 1V.

In some embodiments, the third circuit 26 is a frequency divider. In some embodiments, the third circuit 26 does not output the frequency divider signal S10 when the voltage of the second signal S2 is within the first voltage range, and when the voltage of the third signal S3 is within the second voltage range. In some embodiments, the third circuit 26 does not output the frequency divider signal S10 when the voltage of the eighth signal S8 is within the third voltage range. In some embodiments, the fourth circuit 24 comprises a multiplexer. In some embodiments, the fourth circuit 24 comprises a summer. In some embodiments, the fourth circuit 24 comprises a comparator.

In some embodiments, the second circuit 30 comprises an accumulator. In some embodiments, the second circuit 30 uses the frequency divider signal S10 as a driving clock signal. In some embodiments, the second circuit 30 is configured to adjust the code of coarse-tuning In some embodiments, the second circuit 30 is configured to increase the code of coarse-tuning when the voltage of the second signal S2 is within the first voltage range. In some embodiments, the second circuit 30 is configured to decrease the code of coarse-tuning when the voltage of the third signal S3 is within the second voltage range. In some embodiments, the second circuit 30 comprises a multiplexer and a summer.

Figure 2:
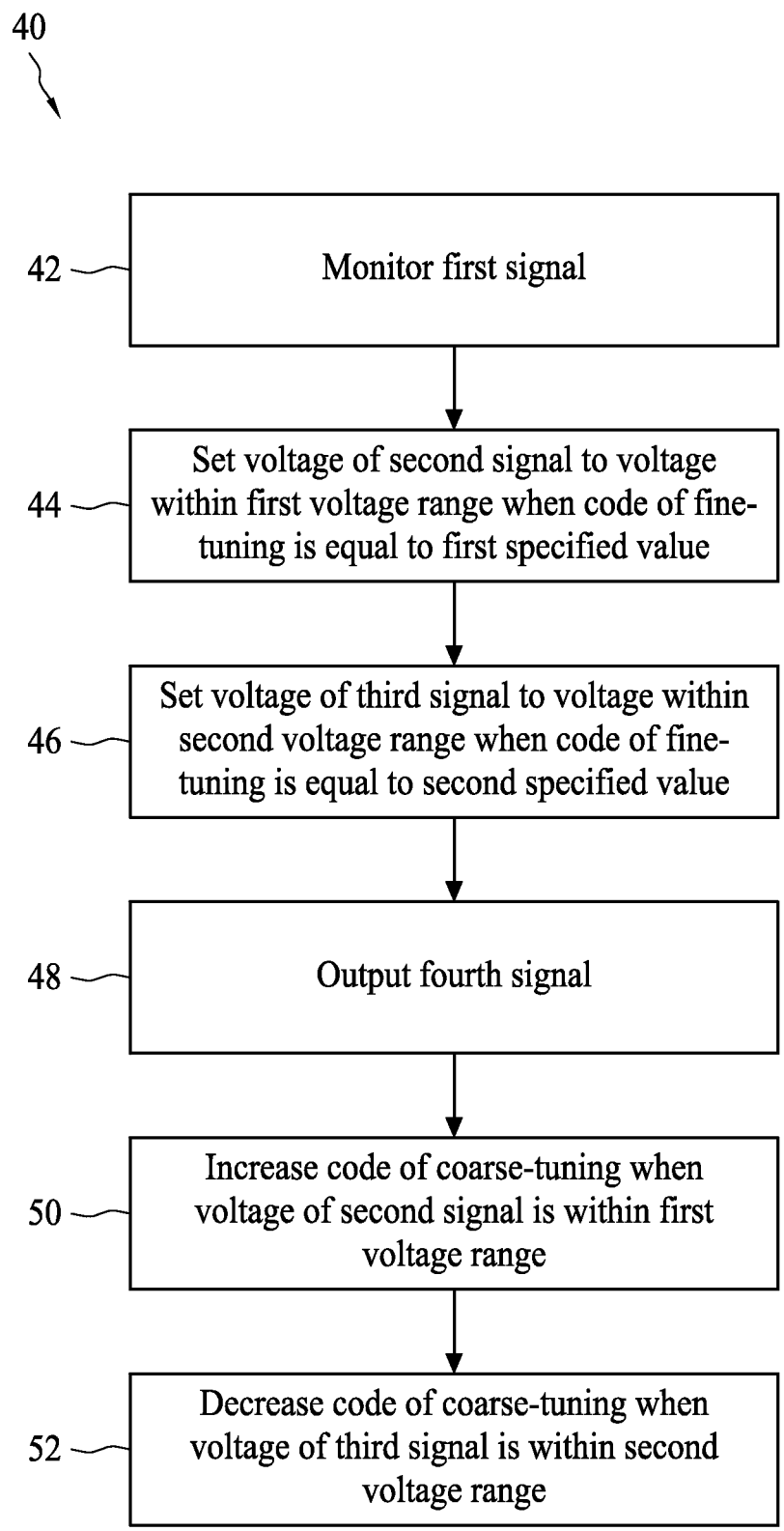
FIG. 2 illustrates a flow diagram of a method, in accordance with some embodiments.

FIG. 2 illustrates a method 40 of operating the ADPLL in accordance with some embodiments. In some embodiments, at 42, the first signal S1 is monitored by the first circuit 14. In some embodiments, at 44, the first circuit 14 is configured to set a voltage of the second signal S2 to a voltage within the first voltage range when the code of fine-tuning is equal to the first specified value. In some embodiments, at 46, the first circuit 14 is configured to set a voltage of the third signal S3 to a voltage within the second voltage range when the code of fine-tuning is equal to the second specified value. In some embodiments, at 48, the second circuit 30 is configured to output the fourth signal S4 comprising the code of coarse-tuning. In some embodiments, at 50, the second circuit 30 is configured to increase the code of coarse-tuning when the voltage of the second signal S2 is within the first voltage range. In some embodiments, at 52, the second circuit 30 is configured to decrease the code of coarse-tuning when the voltage of the third signal S3 is within the second voltage range.

In some embodiments, implementing the ADPLL by dynamically controlling the code of coarse-tuning, as shown with method 40, decreases the covering range ratio of the ADPLL, as opposed to not dynamically controlling the code of coarse-tuning. In some embodiments, the covering range ratio of the ADPLL can be less than 5 if the ADPLL has a system that dynamically controls the code of coarse-tuning according to the method 40.

Figure 3:
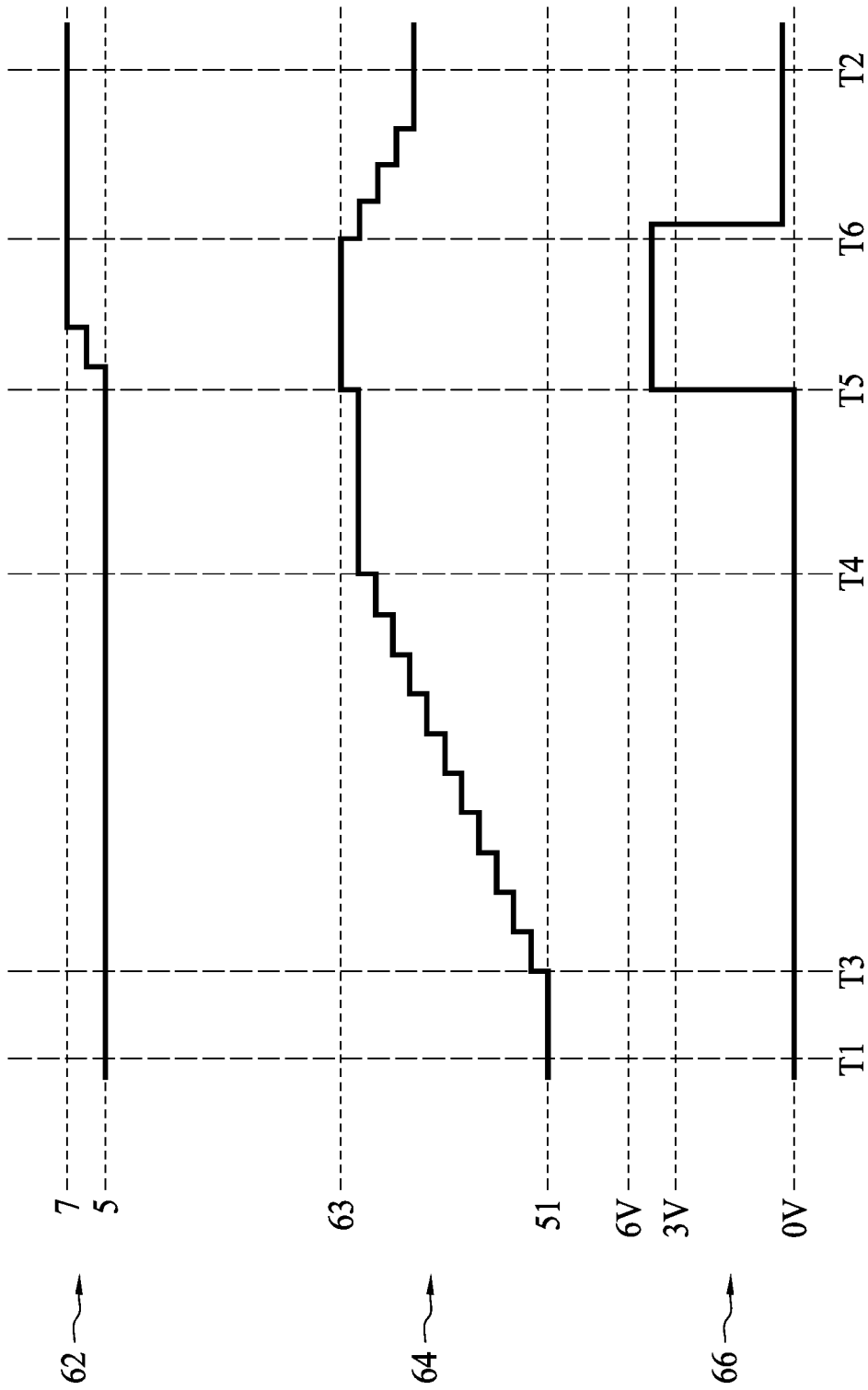
FIG. 3 is an illustration of waveforms, in accordance with some embodiments.

FIG. 3 is an illustration of waveforms corresponding to an example implementation of the ADPLL in accordance with some embodiments. In some embodiments, a first waveform 62 illustrates values of a code of coarse-tuning from a first point in time T1 to a second point in time T2. In some embodiments, a second waveform 64 illustrates values of a code of fine-tuning from the first point in time T1 to the second point in time T2. In some embodiments, a third waveform 66 illustrates voltages of the second signal S2 from the first point in time T1 to the second point in time T2. The third waveform 66 illustrates that at the first point in time T1, the voltage of the second signal S2 is substantially equal to 0 V. In the example implementation, the first frequency is equal to 5 MHz or similar. With the covering range ratio equal to 5, the covering range of the fine-tuning stage is 25 MHz or similar. In the example implementation, the second frequency is equal to 400 kHz or similar. In this way, in the example implementation, the first specified value is equal to 63. In the example implementation, at the first point in time T1, the code of coarse-tuning is equal to 5. In the example implementation, at the first point in time T1, the code of fine-tuning is equal to 51. In some embodiments, at the first point in time T1, the fine-tuning output frequency is equal to the second frequency multiplied by the code of fine-tuning, which is equal to 400 kHz multiplied by 51, which is equal to 20.4 MHz. In some embodiments, at the first point in time T1, the coarse-tuning output frequency is equal to the first frequency multiplied by the code of coarse-tuning, which is equal to 5 MHz multiplied by 5, which is equal to 25 MHz. In the example implementation, at the first point in time T1, the frequency of the output waveform is equal to about 45.4 MHz, which is equal to the target frequency, which is found by adding the coarse-tuning output frequency to the fine-tuning output frequency. In the example implementation, after the first point in time T1, PVT variations occur. In the example implementation, the PVT variations cause the frequency of the output waveform to decrease. In the example implementation, at a third point in time T3, the code of fine-tuning starts to increase in order to increase the frequency of the output waveform to the target frequency. In some embodiments, at the third point in time T3, the code of fine-tuning begins to increment In the example implementation, at a fourth point in time T4, the frequency of the output waveform is substantially equal to the target frequency and the code of fine-tuning settles at 62. In the example implementation, after the fourth point in time T4, PVT variations occur. In the example implementation, the PVT variations cause the frequency of the output waveform to decrease. In the example implementation, at a fifth point in time T5, the code of fine-tuning is increased to 63, which is the first specified value. In the example implementation, the code of fine-tuning being equal to the first specified value causes the voltage of the second signal S2 to change from 0 V to a voltage within the first voltage range which comprises voltages between about 3 V to about 5 V. In the example implementation, after the fifth point in time T5, the voltage of the second signal S2 being within the first voltage range causes the code of coarse-tuning to increase. In the example implementation, after the fifth point in time T5, the code of coarse-tuning increments twice such that before a sixth point in time, the code of coarse-tuning is equal to 7. In the example implementation, at a sixth point in time, the code of fine-tuning begins to decrease. In the example implementation, at the sixth point in time, the code of fine-tuning begins to decrement until it the code of fine-tuning is equal to 59. In the example implementation, the code of fine tuning being less than the second specified value causes the voltage of the second signal S2 to change from a voltage within the first voltage range to about 0 V.

Figure 4:
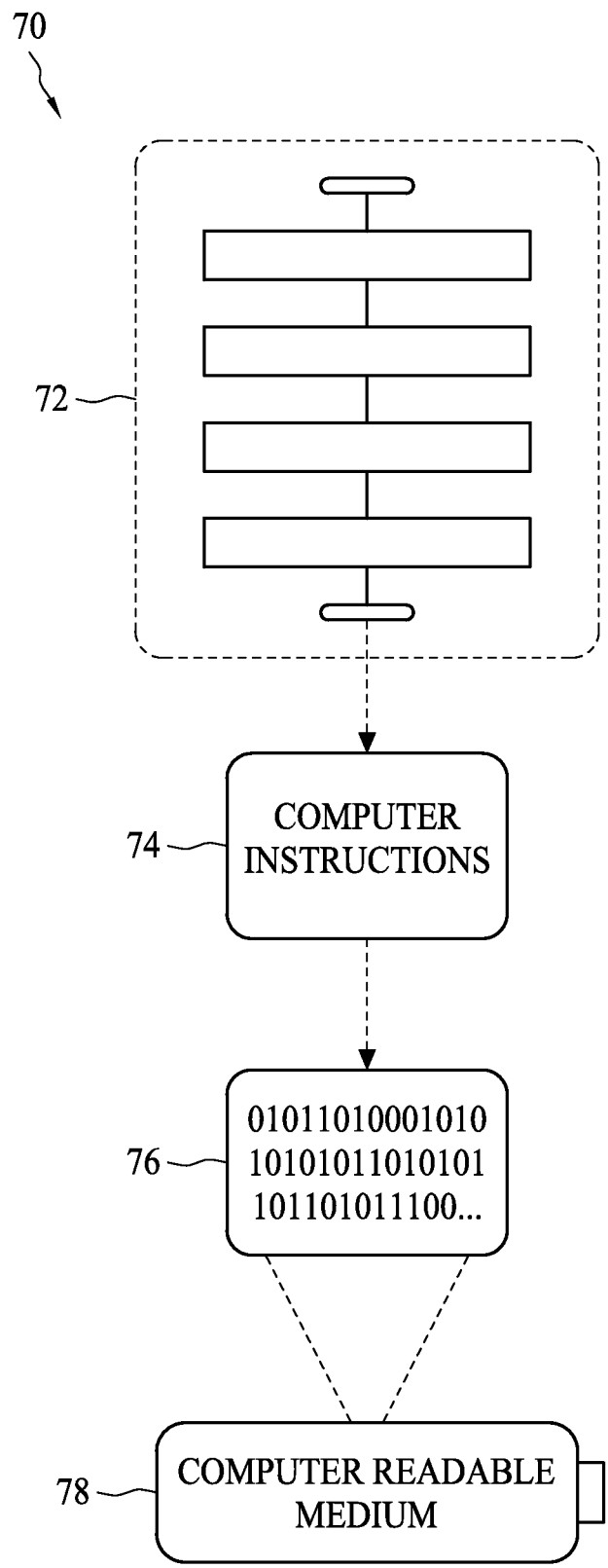
FIG. 4 illustrates an example computer-readable medium or computer-readable device comprising processor-executable instructions configured to embody one or more of the provisions set forth herein, according to various embodiments.

Still another embodiment involves a computer-readable medium comprising processor-executable instructions configured to implement one or more of the techniques presented herein. An example embodiment of a computer-readable medium and/or a computer-readable device that is devised in these ways is illustrated in FIG. 4, wherein the implementation 70 comprises a computer-readable medium 78, such as a CD-R, DVD-R, flash drive, a platter of a hard disk drive, etc., on which is encoded computer-readable data 76. This computer-readable data 76 in turn comprises a set of computer instructions 74 configured to operate according to one or more of the principles set forth herein. In one such embodiment 70, the processor-executable computer instructions 74 is configured to perform a method 72, such as at least some of the exemplary method 40 of FIG. 2, for example. Many such computer-readable media are devised by those of ordinary skill in the art that are configured to operate in accordance with the techniques presented herein.

In some embodiments, an ADPLL is provided, comprising a first circuit and a second circuit. In some embodiments, the first circuit is configured to monitor a first signal. In some embodiments, the first signal comprises a code of fine-tuning. In some embodiments, the first circuit is configured to output a second signal. In some embodiments, the second signal has a voltage within a first voltage range when the code of fine-tuning is equal to a first specified value. In some embodiments, the first circuit is configured to output a third signal. In some embodiments, the third signal has a voltage within a second voltage range when the code of fine-tuning is equal to a second specified value. In some embodiments, the second circuit is configured to output a fourth signal. In some embodiments, the fourth signal comprises a code of coarse-tuning. In some embodiments, the second circuit is configured to increase the code of coarse-tuning when the voltage of the second signal is within the first voltage range. In some embodiments, the second circuit is configured to decrease the code of coarse-tuning when the voltage of the third signal is within the second voltage range.

In some embodiments, an ADPLL is provided, comprising a first circuit, a logic gate, a third circuit, a fourth circuit and a second circuit. In some embodiments, the first circuit is configured to monitor a first signal, the first signal comprising a code of fine-tuning. In some embodiments, the first circuit is configured to detect when the code of fine-tuning is equal to a first specified value. In some embodiments, the first circuit is configured to detect when the code of fine-tuning is equal to a second specified value. In some embodiments, the first circuit is configured to output a second signal, the second signal having a voltage within a first voltage range when the code of fine-tuning is equal to the first specified value. In some embodiments, the first circuit is configured to output a third signal, the third signal having a voltage within a second voltage range when the code of fine-tuning is equal to the second specified value. In some embodiments, the logic gate is configured to receive the second signal, receive the third signal and output a fifth signal based upon the second signal and the third signal. In some embodiments, the third circuit is configured to receive a sixth signal, receive a reference frequency signal and output a frequency divider signal. In some embodiments, the fourth circuit is configured to monitor a fourth signal, the fourth signal comprising a code of coarse-tuning. In some embodiments, the fourth circuit configured to detect when the code of coarse-tuning is equal to a third specified value. In some embodiments, the fourth circuit is configured to detect when the code of coarse-tuning is equal to a fourth specified voltage. In some embodiments, the fourth circuit is configured to output an eighth signal, the eighth signal having a voltage within a third voltage range when the code of coarse-tuning is equal to the third specified value and when the code of coarse-tuning is equal to the fourth specified value. In some embodiments, the second circuit is configured to receive the frequency divider signal, receive the second signal, receive the third signal, receive a seventh signal and output the fourth signal based upon the frequency divider signal, the second signal, the third signal and the seventh signal.

In some embodiments, a method of operating an ADPLL is provided. In some embodiments, the method comprises monitoring a first signal, the first signal comprising a code of fine-tuning. In some embodiments, the method comprises setting a voltage of a second signal to a voltage within a first voltage range when the code of fine-tuning is equal to a first specified value. In some embodiments, the method comprises setting a voltage of a third signal to a voltage within a second voltage range when the code of fine-tuning is equal to a second specified value. In some embodiments, the method comprises outputting a fourth signal comprising a code of coarse-tuning. In some embodiments, the method comprises increasing the code of coarse-tuning when the voltage of the second signal is within the first voltage range. In some embodiments, the method comprises decreasing the code of coarse-tuning when the voltage of the third signal is within the second voltage range.

ADPLL With Across-Stage DCO Controller

Figure 5:
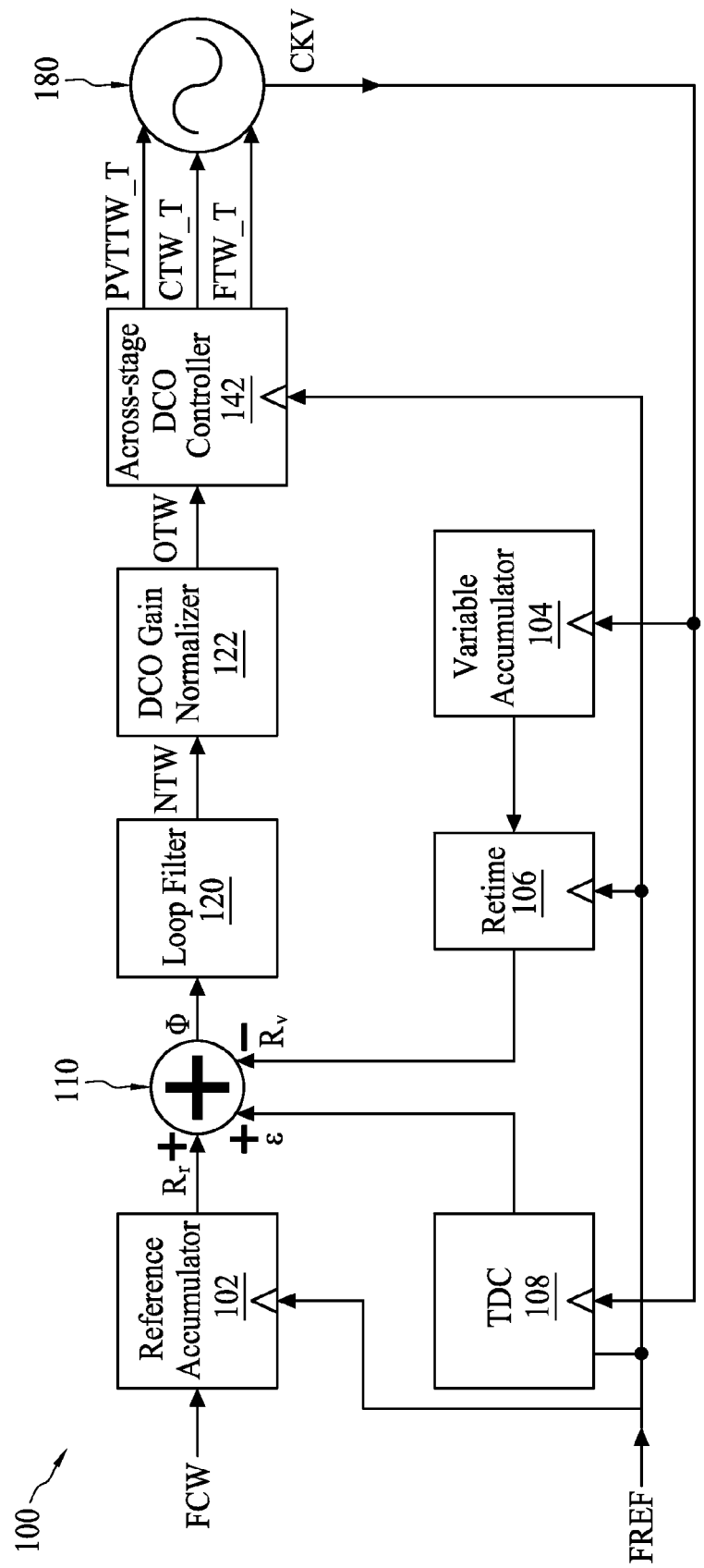
FIG. 5 is a schematic block diagram of an ADPLL in accordance with some embodiments.

FIG. 5 is a schematic block diagram of an ADPLL 100 in accordance with some embodiments. The ADPLL 100 includes a reference accumulator 102, a time-to-digital converter (TDC) 108, a variable accumulator 104, a retime element 106 and a summing element 110 for generating a phase error Φ, a loop filer 120 and a DCO-gain normalizer for converting the phase error Φ into an oscillator tuning code OTW, an across-stage DCO controller 142 for producing tuning codes PVTTW_T, CTW_T and FTW_T that control the DCO 180 at different frequency step sizes, respectively, and a DCO which generates an oscillator signal CKV tuned in accordance with the tuning codes PVTTW_T, CTW_T and FTW_T.

The reference accumulator 102 receives a reference signal FREF and a frequency control code FCW which is the ratio of the desired frequency of the oscillator signal CKV divided by the frequency of the reference signal FREF. The reference accumulator 102 generates a reference phase signal $R_r$ which is an accumulation of the frequency control code FCW at an active edge of the reference signal FREF.

The TDC 108 determines a time difference between active edges of the oscillator signal CKV and the reference signal FREF, represents the time difference as a digital value and normalizes the phase difference as a fraction of a clock cycle of the oscillator signal CKV to generate a fractional error ε.

The variable accumulator 104 increments a count on each active edge of the oscillator signal CKV, and the retime element 106 latches the count at each active edge of the reference signal FREF.

The summing element 110 determines the phase error Φ as $R_r-(R_v-\epsilon)$. Depending on the amount of the phase error Φ, the ADPLL 100 enters different tuning stages. The different tuning stages include a PVT tuning stage, a coarse tuning stage and a fine tuning stage which are listed in the order of descending covering frequency ranges and also in the order of descending frequency step sizes. The ADPLL 100 enters the stages in sequence. As the ADPLL 100 settles in the PVT tuning stage and enters the coarse tuning stage, the ADPLL 100, for example, begins the covering frequency range at an output frequency CKV(f) settled in the previous stage, i.e., the PVT tuning stage, and tunes the output frequency CKV(f) with a step size finer than that in the PVT tuning stage. As the ADPLL 100 settles in the coarse tuning stage and enters the fine tuning stage, the ADPLL 100, for example, beings the covering frequency range at an output frequency CKV(f) settled in the previous stage, i.e. the coarse tuning stage, and tunes the output frequency CKV(f) with a step size finer than that in the coarse tuning stage.

The loop filter 120 controls a normalized tuning code NTW depending on the phase error Φ. The loop filter 120 can be set so that time for the ADPLL 100 to be settled in, for example, the PVT tuning stage and the coarse tuning stage can be faster than that of the fine tuning stage. In addition, the loop filter 120 also includes a low-pass filter for attenuating unwanted spurs and phase noise at higher frequencies.

The DCO gain normalizer 122 normalizes the normalized tuning code NTW into the oscillator tuning code OTW by multiplying the normalized tuning code NTW with the reference frequency FREF(f) divided by a DCO gain. The DCO gain corresponds to a DCO resolution, i.e. how much the output frequency is changed by an LSB integer change of the oscillator tuning code OTW. Because the DCO operating in different stages have different frequency covering ranges, the DCO gain will be different in each stage.

The across-stage DCO controller 142 receives the oscillator tuning code OTW and provides the tuning codes including retimed PVT tuning code PVTTW_T, retimed coarse tuning code CTW_T and retimed fine tuning code FTW_T. At the PVT tuning stage, the oscillator tuning code OTW is used for generating the PVT tuning code PVTTW_T. The coarse tuning code CTW_T and the fine tuning code FTW_T remain default. After the ADPLL 100 settles in the PVT tuning stage, the ADPLL 100 enters the coarse tuning stage. At the coarse tuning stage, the oscillator tuning code OTW is used for generating the coarse tuning code CTW_T. The PVT tuning code PVTTW_T remains the settled value in the previous stage and the fine tuning code FTW_T remains default. After the ADPLL 100 settles in the coarse tuning stage, the ADPLL 100 enters the fine tuning stage. At the fine tuning stage, the oscillator tuning code OTW is used for generating the fine tuning code FTW_T. The PVT tuning code PVTTW_T and the coarse tuning code CTW_T remain settled values in the previous stages. After the ADPLL 100 settles in the fine tuning stage, the ADPLL 100 remains in the fine tuning stage so that the output frequency can be adjusted in response to PVT variations.

PVT variations such as a temperature variation can cause the settled output frequency CKV(f) in the fine tuning stage to deviate from the reference frequency FREF(f). When the across-stage DCO controller 142 detects that deviation cannot be covered by the frequency covering range of the fine tuning stage, the across-stage DCO controller 142 automatically adjusts the coarse tuning code CTW_T from the coarse tuning stage.

The DCO 180 converts the tuning codes PVTTW_T, CTW_T and FTW_T into the output frequency CKV(f) of the oscillator signal CKV. In some embodiments, the DCO 180 includes cascaded delay stages each include driver elements and capacitive elements that can be switched on or off in response to the corresponding tuning code PVTTW_T, CTW_T or FTW_T. In some embodiments, the frequency covering range of each tuning stage is determined by number of elements in each delay stage that can be controlled by the corresponding tuning code.

Figure 6:
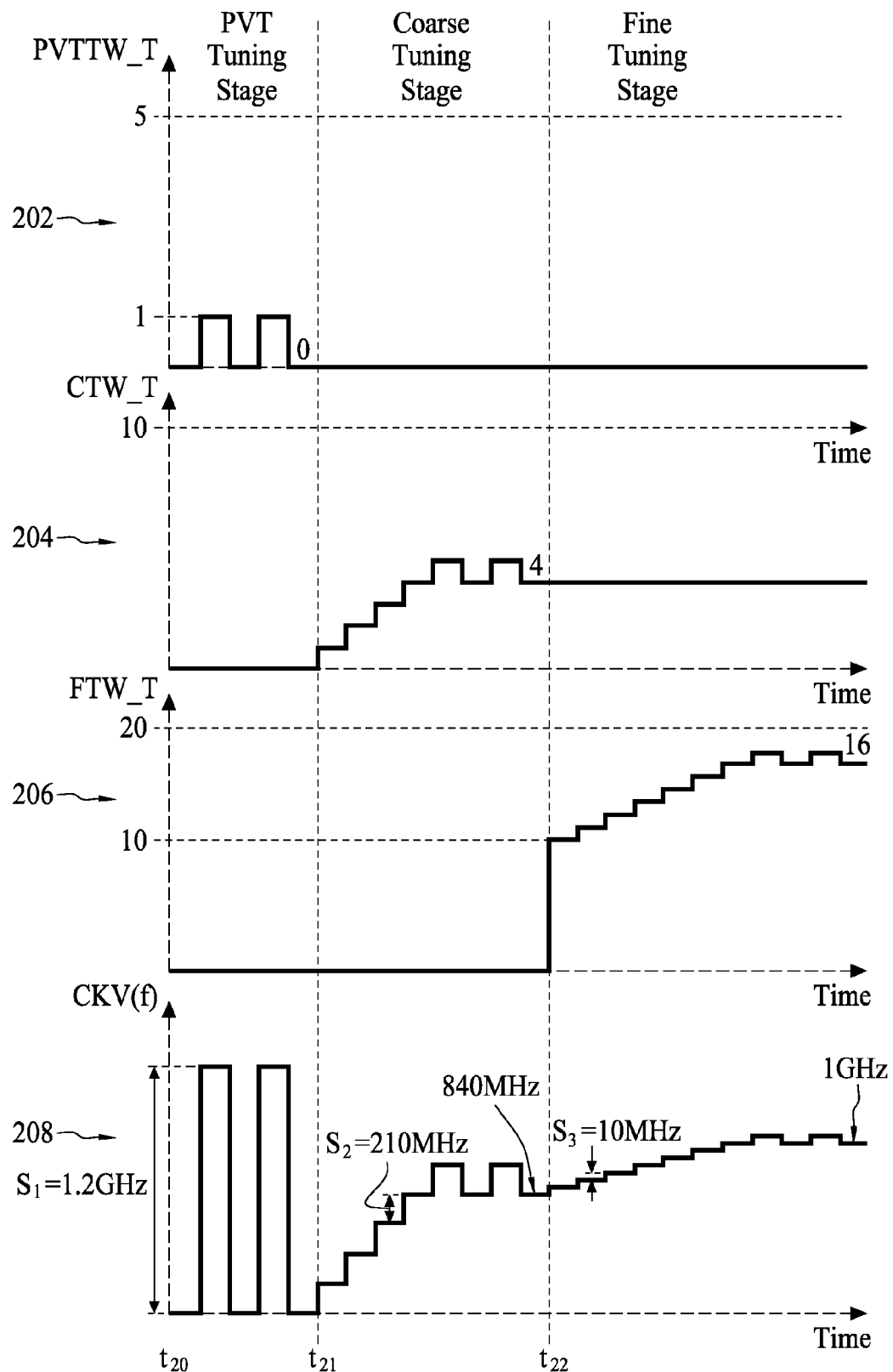
FIG. 6 is a diagram including schematic timing diagrams of the PVT tuning code, the coarse tuning code, fine tuning code and the output frequency, respectively, in accordance with some embodiments.

FIG. 6 is a diagram including schematic timing diagrams 202, 204, 206, 208 of the PVT tuning code PVTTW_T, the coarse tuning code CTW_T, the fine tuning code FTW_T and the output frequency CKV(f), respectively in accordance with some embodiments. Referring to FIG. 5 and FIG. 6, suppose the ADPLL 100 receives the reference frequency FREF(f) of 1 GHz and targets the output frequency CKV(f) at 1 GHz. Initially at time $t_{20}$, the ADPLL 100 enters the PVT tuning stage which tunes the output frequency CKV(f) at a step size $S_1$ of 1.2 GHz. During the PVT tuning stage, the oscillator tuning code OTW is translated into the PVT tuning code PVTTW_T. The PVT tuning code PVTTW_T can be tuned from 0 to 5. Therefore, the frequency covering range of the PVT tuning stage is 6 GHz. Because the reference frequency FREF(f) is smaller than the step size $S_1$ of the PVT tuning stage, the PVT tuning code PVTTW_T fluctuates between 1 and 0 at each active edge of the reference signal FREF until the PVT tuning code PVTTW_T is settled at 0 after a predetermined time period has elapsed.

At time $t_{21}$, the ADPLL 100 enters the coarse tuning stage which tunes the output frequency CKV(f) at a step size $S_2$ of 210 MHz. During the coarse tuning stage, the output frequency CKV(f) starts at the value settled in the previous stage which is 0 Hz. The oscillator tuning code OTW is translated into the coarse tuning code CTW_T. The coarse tuning code CTW_T can be tuned from 0 to 10. As a result, the frequency covering range of the coarse tuning stage is 2.1 GHz. In the coarse tuning stage, the coarse tuning code CTW_T is increased by a step at each active edge of the reference signal FREF until the coarse tuning code CTW_T reaches 5, and then fluctuates between 4 and 5 until it is settled at 4, which corresponds to the output frequency CKV(f) of 840 MHz.

At time $t_{22}$, the ADPLL 100 enters the fine tuning stage which tunes the output frequency CKV(f) at a step size $S_3$ of 10 MHz. During the fine tuning stage, the output frequency CKV(f) starts at the value settled in the previous stage which is 840 MHz. The oscillator tuning code OTW is translated into the fine tuning code FTW_T. The fine tuning code FTW_T can be tuned from 0 to 20. Hence, the frequency covering range of the fine tuning stage is 200 MHz. The fine tuning code FTW_T starts at 10 at time $t_{22}$ and is increased by a step at each active edge of the reference signal FREF until the fine tuning code FTW_T reaches 16, and then fluctuates between 16 and 17 until settled at 16. Correspondingly, the output frequency CKV(f) is settled at 1 GHz.

The number of tuning stages set forth in the present disclosure is exemplary. Different numbers of tuning stages are within the contemplated scope of the present disclosure.

Figure 7:
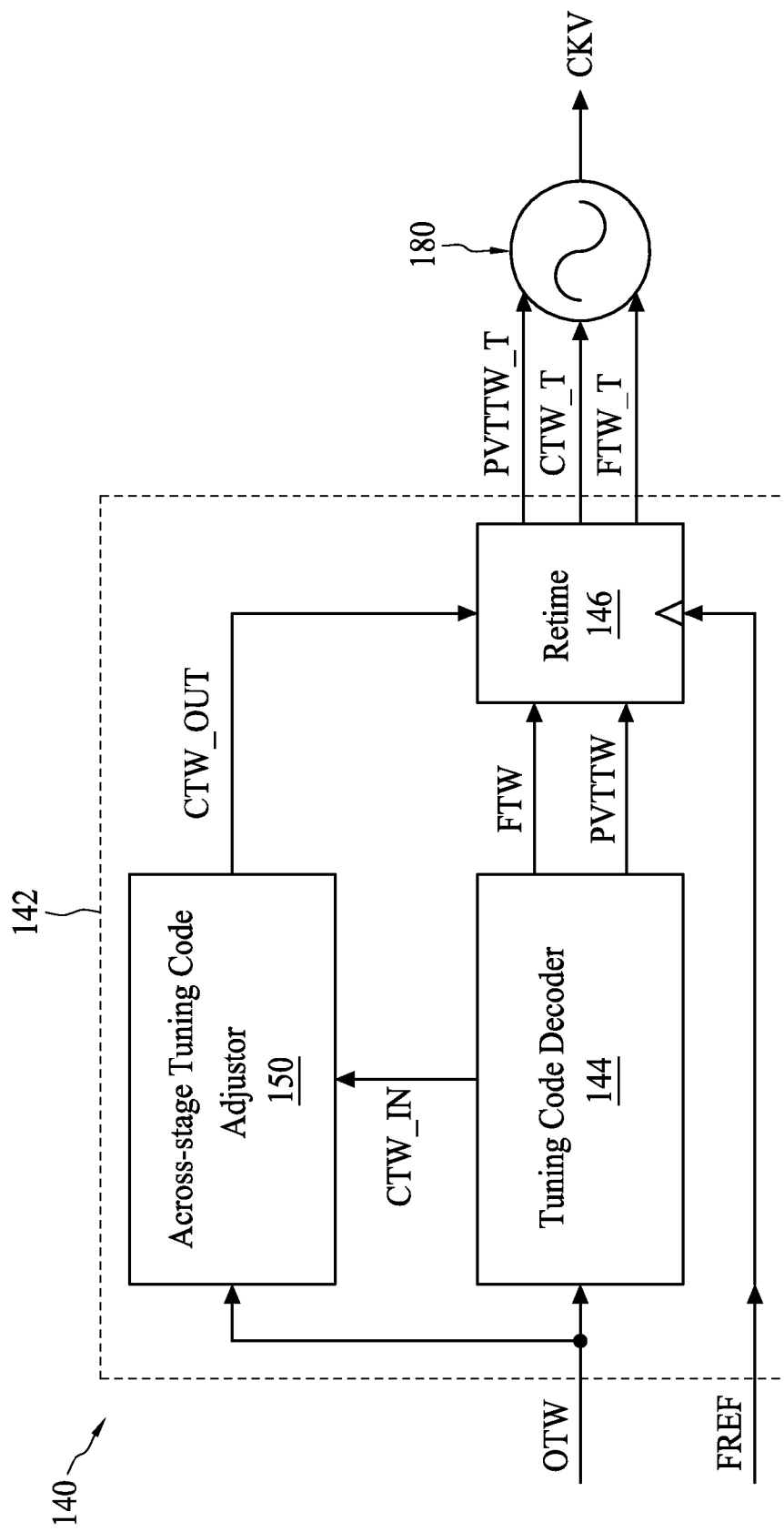
FIG. 7 is a schematic block diagram of an across-stage controlled DCO in accordance with some embodiments.

FIG. 7 is a schematic block diagram of an across-stage controlled DCO 140 in accordance with some embodiments. The across-stage controlled DCO 140 includes the across-stage DCO controller 142 and the DCO 180. The across-stage DCO controller 142 includes a tuning code decoder 144, an across-stage tuning code adjustor 150 and retime elements 146.

The tuning code decoder 144 receives the oscillator tuning code OTW and converts the code OTW which is signed and binary-coded into a PVT tuning code PVTTW, a coarse tuning code CTW_IN or a fine tuning code FTW which is unsigned and thermometer-coded, depending which tuning stage the ADPLL 100 (shown in FIG. 5) is operated under. An example illustrating the binary-coded OTW and the thermometer-coded FTW is provided with respect to FIG. 8. The tuning code decoder 144 records the settled tuning code of the current stage before entering into the subsequent stage. The fine tuning stage being the current stage is used as an example below. During the fine tuning stage, the tuning code decoder 144 translates the binary-coded OTW into the thermometer-coded FTW and provides the fine tuning code FTW and the recorded PVT tuning code PVTTW to the retime elements 146. The tuning code decoder 144 further provides the recorded coarse tuning code CTW_IN to the across-stage tuning code adjustor 150.

The across-stage tuning code adjustor 150 receives the coarse tuning code CTW_IN and generates a coarse tuning code CTW_OUT. When the oscillator tuning code OTW does not exceed the corresponding frequency covering range of the fine tuning stage, the coarse tuning code CTW_OUT is the unadjusted coarse tuning code CTW_IN. On the other hand, when the oscillator tuning code OTW exceeds the corresponding frequency covering range of the fine tuning stage, the across-stage tuning code adjustor 150 automatically adjusts the coarse tuning code CTW_IN to generate the coarse tuning code CTW_OUT.

The retime elements 146 receive the PVT tuning code PVTTW from the tuning code decoder 144, the coarse tuning code CTW_OUT from the across-stage tuning code adjustor 150 and the fine tuning code FTW from the tuning code decoder 144, and synchronize the tuning codes PVTTW, CTW_OUT and FTW with respect to the reference signal FREF to generate retimed tuning codes PVTTW_T, CTW_T and FTW_T. The retimed tuning codes PVTTW_T, CTW_T and FTW_T control the output frequency CKV(f) of the oscillator signal CKV generated by the DCO 180.

Figure 8:
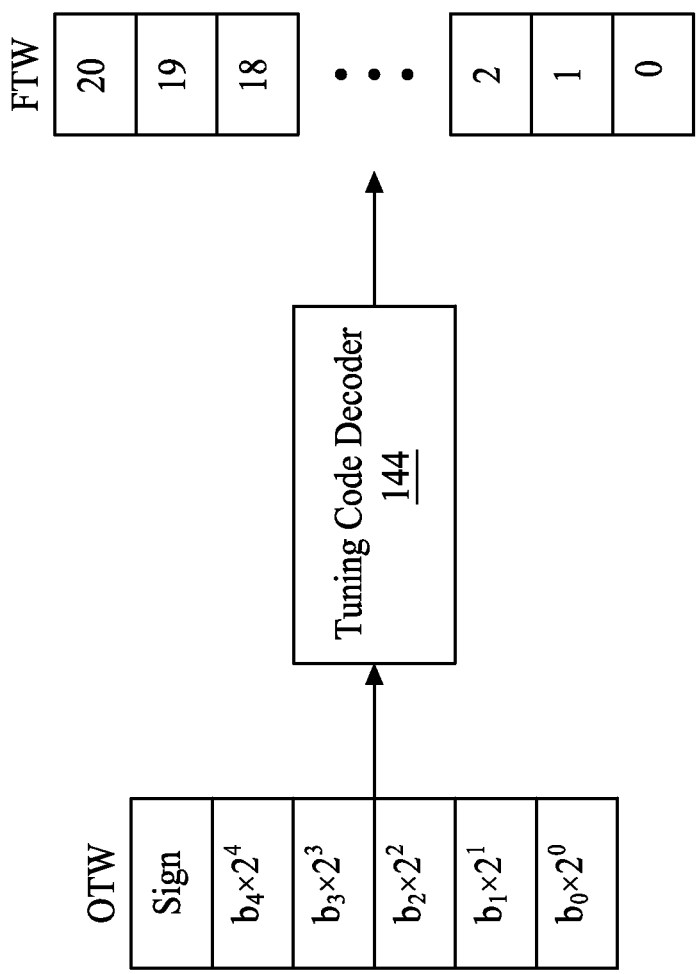
FIG. 8 is a diagram illustrating an example of translating a signed binary-coded OTW to an unsigned thermometer-coded FTW by the tuning code decoder in accordance with some embodiments.

FIG. 8 is a diagram illustrating an example of translating the signed binary-coded OTW to the unsigned thermometer-coded FTW by the tuning code decoder 144 in accordance with some embodiments. In some embodiments, the binary-coded OTW is signed, and the thermometer-coded FTW is unsigned. For the binary-coded OTW, five bits $b_0, b_1 \ldots$ and $b_4$ are used to represent numbers from 0 to 20. A sign bit indicates whether the oscillator tuning code OTW is a negative number. In some embodiments, when the binary-coded OTW is a non-negative number from 0 to 20, it is converted into a thermometer-coded FTW with the corresponding number of bits of "1"s. For example, the number 20 is represented by 20 bits of "1"s. In some embodiments, when the binary-coded OTW is a number larger than 20, it indicates that the OTW overflows and the OTW is mapped to 20 when being represented by the thermometer-coded FTW. When the binary-coded OTW is a negative number, it indicates that the OTW underflows and the OTW is mapped to 0 when being represented by the thermometer-coded FTW.

Figure 9:
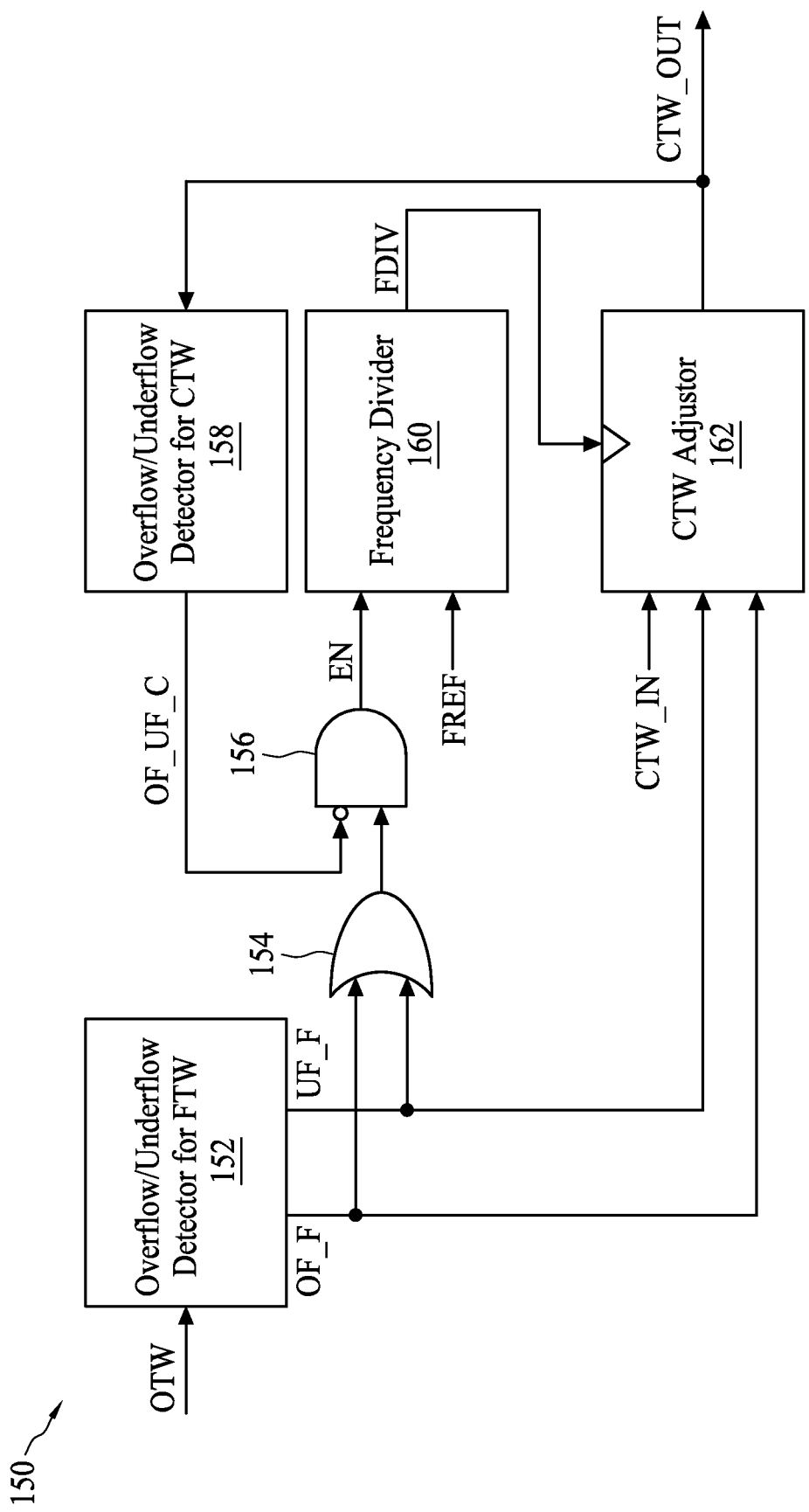
FIG. 9 is a schematic block diagram of the across-stage tuning code adjustor in accordance with some embodiments.

FIG. 9 is a schematic block diagram of the across-stage tuning code adjustor 150 in accordance with some embodiments. The across-stage tuning code adjustor 150 includes an overflow/underflow detector for fine tuning code 152, a coarse tuning code adjustor 162, an OR gate 154, an AND gate 156, an overflow/underflow detector for coarse tuning code 158 and a frequency divider 160. Suppose the current stage is the fine tuning stage. The overflow/underflow detector for fine tuning code 152 receives the oscillator tuning code OTW and detects whether the oscillator tuning code OTW overflows or underflows. When the oscillator tuning code OTW overflows, it is larger than a number that corresponds to an upper bound of the frequency covering range of the fine tuning stage. For example, as shown in the timing diagram 206 of the retimed fine tuning code FTW_T in FIG. 6, the number that corresponds to the upper bound of the frequency covering range is 20. When the oscillator tuning code OTW is larger than 20, the output frequency CKV(f) will have to be adjusted by more than 200 MHz in the fine tuning stage. Similarly, when the oscillator tuning code OTW underflows, it is smaller than a number that corresponds to a lower bound of the frequency covering range of the fine tuning stage. In the timing diagram 206 of the retimed fine tuning code FTW_T in FIG. 6, it is shown that the number that corresponds to the lower bound of the frequency covering range is 0. When the oscillator tuning code OTW is smaller than 0, the output frequency CKV(f) will have to be adjusted by less than 0 Hz in the fine tuning stage. When the detector for fine tuning code 152 detects the oscillator tuning code OTW overflows, an overflow detect signal OF_F is asserted. When the detector for fine tuning code 152 detects the oscillator tuning code OTW underflows, an underflow detect signal UF_F is asserted.

The coarse tuning code adjustor 162 receives the coarse tuning CTW_IN, the overflow detect signal OF_F, the underflow detect signal UF_F and a frequency divided signal FDIV. The coarse tuning code CTW_IN is the coarse tuning code obtained from the coarse tuning stage. When the overflow detect signal OF_F indicates the oscillator tuning code OTW overflows, the coarse tuning code adjustor 162 increases the coarse tuning code CTW_IN at an active edge of the frequency divided signal FDIV and outputs the adjusted coarse tuning code CTW_OUT. When the underflow detect signal UF_F indicates the oscillator tuning code OTW underflows, the coarse tuning code adjustor 162 decreases the coarse tuning code CTW_IN at an active edge of the frequency divided signal FDIV and outputs the adjusted coarse tuning code CTW_OUT.

The frequency divider 160 receives the reference signal FREF and an enable signal EN and generates the frequency divided signal FDIV that is active when the enable signal EN asserts, and inactive when the enable signal EN deasserts. A constraint on a period of the frequency divided signal FDIV when the frequency divided signal FDIV is active will be provided with reference to FIG. 13.

The enable signal EN of the frequency divider 160 is generated by the AND gate 156. The AND gate 156 receives an ORed result of the overflow detect signal OF_F and the underflow detect signal UF_F from the OR gate 154 at one input, and receives an inverted overflow/underflow detect signal OF_UF_C at the other input. Effectively, the frequency divider signal FDIV is active when either the oscillator tuning code OTW overflows or underflows and the adjusted coarse tuning code CTW_OUT has not overflowed or underflowed.

The overflow/underflow detect signal OF_UF_C is generated by the overflow/underflow detector for coarse tuning code 158. The overflow/underflow detector 158 detects whether the adjusted coarse tuning code CTW_OUT overflows or underflows. In some embodiments, when the adjusted coarse tuning code CTW_OUT overflows, the adjusted coarse tuning code CTW_OUT has reached a number that corresponds to an upper bound of the frequency covering range of the coarse tuning stage. For example, as shown in the timing diagram 204 of the retimed coarse tuning code CTW_T in FIG. 6, the number that corresponds to the upper bound of the frequency covering range is 10. When the adjusted coarse tuning code CTW_OUT reaches 10, the output frequency CKV(f) cannot be further increased by increasing the coarse tuning code CTW_OUT and therefore, the overflow/underflow detect signal OF_UF_C asserts. Similarly, when the adjusted coarse tuning code CTW_OUT reaches 0, the output frequency CKV(f) cannot be further decreased by decreasing the coarse tuning code CTW_OUT and hence the overflow/underflow detect signal OF_UF_C asserts. Furthermore, because the adjusted coarse tuning code CTW_OUT does not fall below 0, the overflow/underflow detector for the coarse tuning code 158 can be simplified as an unsigned number comparator.

Figure 10:
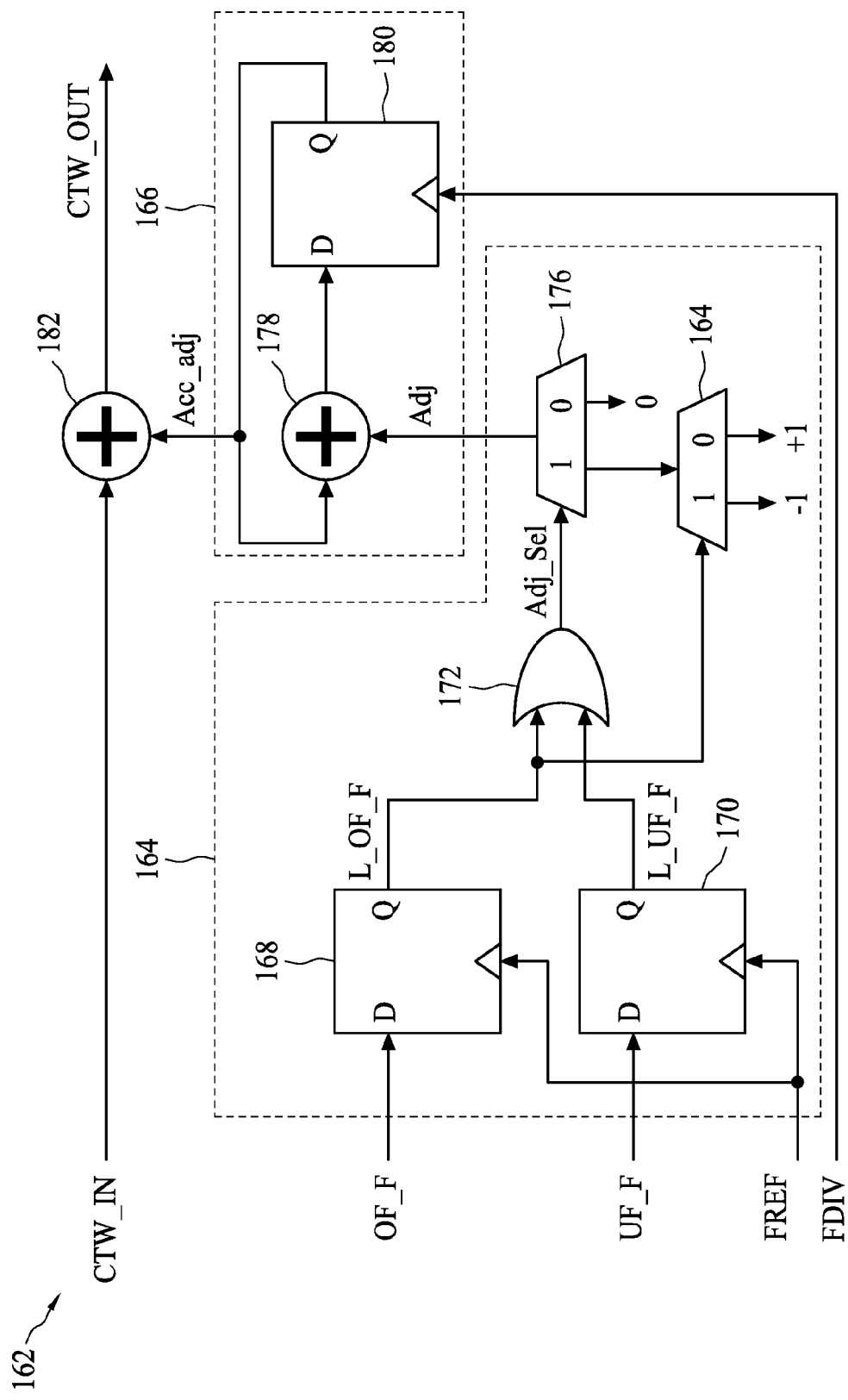
FIG. 10 is a schematic block diagram of the coarse tuning adjustor in accordance with some embodiments.

FIG. 10 is a schematic block diagram of the coarse tuning adjustor 162 in accordance with some embodiments. The coarse tuning adjustor 162 includes an adjustment selector 164, an adjustment accumulator 166 and a summing element 182. The adjustment selector 164 is configured to select one of an increment, a decrement and zero as an adjustment Adj in response to the overflow detect signal OF_F and the underflow detect signal UF_F. The adjustment selector 164 includes D flip-flops 168 and 170, an OR gate 172, and multiplexers 174 and 176. The D flip-flops 168 and 170 latch the overflow detect signal OF_F and the underflow detect signal UF_F, respectively, at an active edge of the reference signal FREF. The latched overflow detect signal L_OF_F and the latched underflow detect signal L_UF_F from the D flip-flops 168 and 170, respectively, are ORed by the OR gate 172 to generate an adjustment selection signal Adj_sel. The multiplexer 176 is controlled by the adjustment selection signal Adj_sel to select whether to provide zero or another value for adjustment. The multiplexer 174 is controlled by the latched overflow detect signal L_OF_F to select whether to provide the increment +1 or the decrement −1 when a value other than zero is selected to be provided as the adjustment Adj.

The adjustment accumulator 166 includes a summing element 178 and a D flip-flop 180. The summing element 178 adds the adjustment Adj to an accumulated adjustment Acc_adj from the output of the D flip-flop 180. The D flip-flop 180 latches the accumulated adjustment Acc_adj on every active edge of the frequency divided signal FDIV.

The summing element 182 adds the accumulated adjustment Acc_adj to the coarse tuning code CTW_IN to generate the coarse tuning code CTW_OUT.

Figure 11:
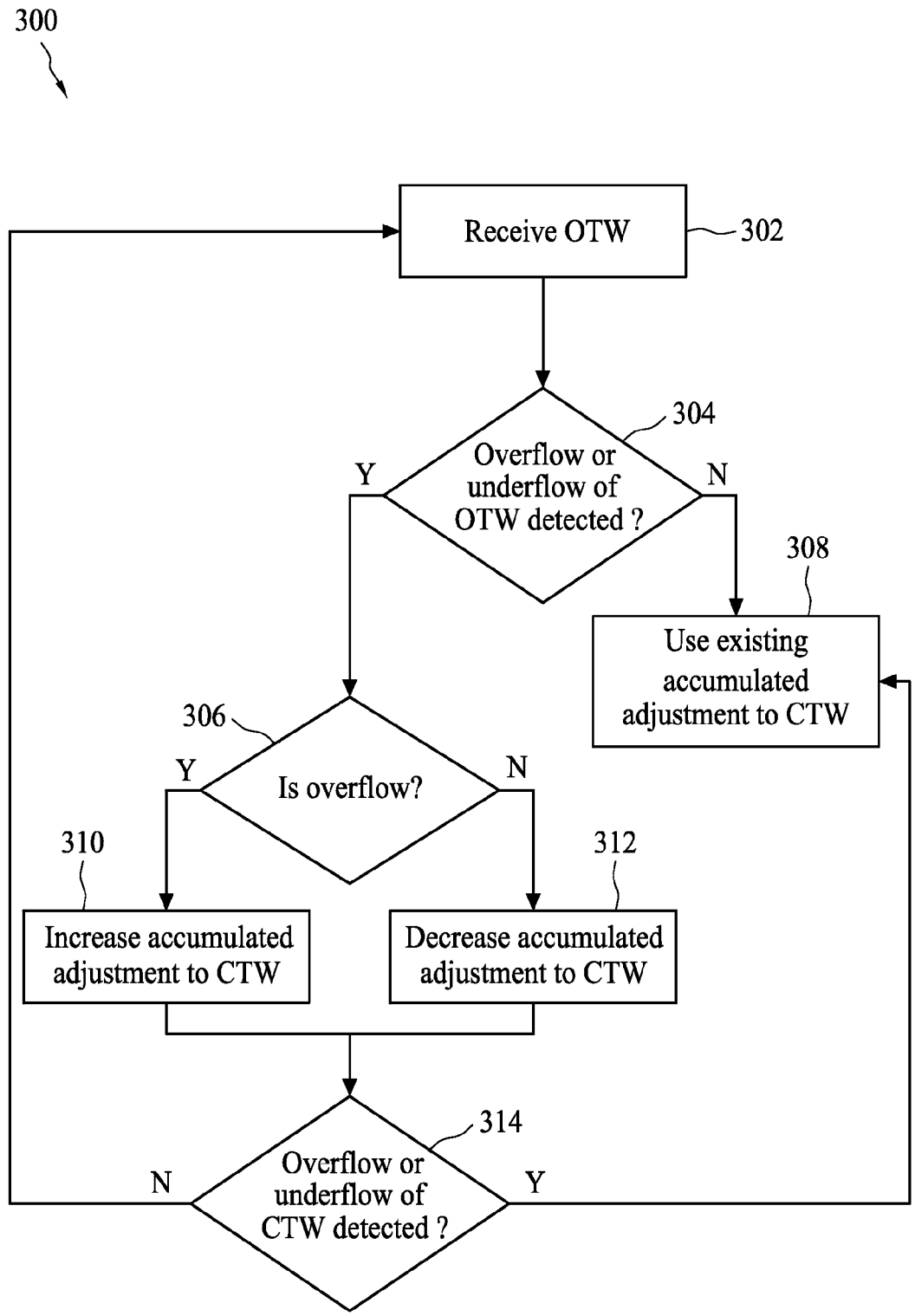
FIG. 11 is a flow diagram of a method performed by the across-stage tuning code adjustor in FIG. 5 in accordance with some embodiments.

FIG. 11 is a flow diagram of a method 300 performed by the across-stage tuning code adjustor 150 in FIG. 9 in accordance with some embodiments. Refer to FIGS. 9 to 11.

In operation 302, the oscillator tuning code OTW is received by the overflow/underflow detector for the fine tuning code 152 during the fine tuning stage.

In operation 304, the overflow/underflow detector for the fine tuning code 152 determines whether overflow or underflow of the oscillator tuning code OTW is detected. If so, the overflow/underflow detector for the fine tuning code 152 asserts either the overflow detect signal OF_F or the underflow detect signal UF_F, and in response, the coarse tuning code adjustor 162 asserts the adjustment selection signal Adj_sel. The method 300 proceeds to operation 306. If not, the coarse tuning code adjustor 162 deasserts the adjustment selection signal Adj_sel, and proceeds to operation 308.

In operation 306, the coarse tuning code adjustor 162 determines whether overflow is detected by checking the latched over flow detect signal L_OF_F. If so, an increment of 1 is selected as the adjustment Adj and the method proceeds to operation 310. If not, a decrement of 1 is selected as the adjustment Adj and the method 300 proceeds to operation 312.

In operation 310, when an active edge of the frequency divided signal FDIV arrives, the accumulated adjustment Acc_adj is incremented and the incremented adjustment Acc_adj is used to modify the coarse tuning code CTW_IN into the coarse tuning code CTW_OUT. Then the method 300 proceeds to operation 314.

In operation 312, when an active edge of the frequency divided signal FDIV arrives, the accumulated adjustment Acc_adj is decremented and the decremented adjustment Acc_adj is used to modify the coarse tuning code CTW_IN into the coarse tuning code CTW_OUT. Then the method 300 proceeds to operation 314.

In operation 314, the overflow/underflow detector for coarse tuning code 158 determines whether overflow or underflow of the adjusted coarse tuning code CTW_OUT is detected. If so, the overflow/underflow detector for the coarse tuning code 158 asserts the overflow/underflow detect signal OF_UF_C and the method proceeds to the operation 308. If not, the overflow/underflow detector for the coarse tuning code 158 is not asserted and the method loops back to the operation 302 to await another oscillator tuning code OTW received.

In operation 308, either the adjustment Adj of 0 is selected in the operation 304 and therefore the accumulated adjustment Acc_adj stays unchanged, or the frequency divider 160 is deactivated by the overflow/underflow detect signal OF_UF_C in the operation 314, and hence the accumulated adjustment Acc_adj stays unchanged. Because the accumulated adjustment Acc_adj stays unchanged, the coarse tuning code CTW_IN has been adjusted using the existing accumulated adjustment Acc_adj, and therefore the coarse tuning code CTW_OUT stays unchanged.

In the embodiments provided above, the method 300 in FIG. 11 is performed by the across-stage tuning code adjustor 150 in FIGS. 9 and 10. The method 300 performed by at least one processor described with reference to FIG. 18 used to implemented a software PLL is within the contemplated scope of the present disclosure.

Figure 12:
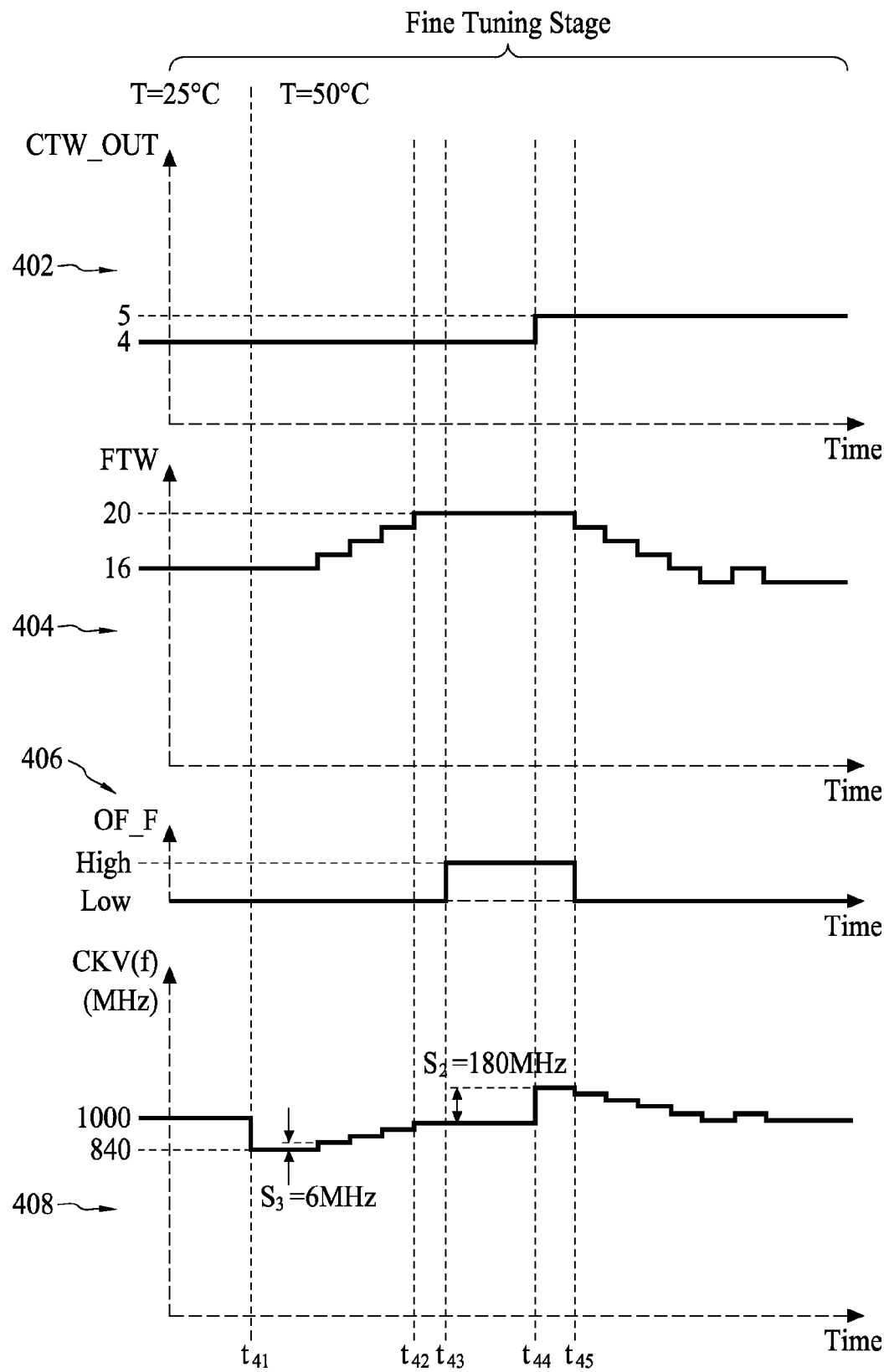
FIG. 12 is a diagram including schematic timing diagrams of the adjusted coarse tuning code, the fine tuning code, the overflow detect signal and the output frequency, respectively, in accordance with some embodiments.

FIG. 12 is a diagram including schematic timing diagrams 402, 404, 406 and 408 of the coarse tuning code CTW_OUT, the fine tuning code FTW, the overflow detect signal OF_F and the output frequency CKV(f), respectively, in accordance with some embodiments. Referring to FIG. 5 and FIG. 12, before time $t_{41}$, an environment temperature that the ADPLL 100 operated under is, for example, 25° C. As described with reference to FIG. 6, for the reference frequency FREF(f) of 1 GHz, the ADPLL 100 has settled the coarse tuning code CTW_IN at 4, the fine tuning code FTW at 16 and the output frequency CKV(f) at 1 GHz and stays in the fine tuning stage. At time $t_{41}$, the environment temperature increases to, for example, 50° C. The temperature variation causes, for example, the delay stages in the DCO 180 to modify the generated delay. Therefore, referring to the diagram 408, the frequency step size $S_2$ of the coarse tuning code CTW_T decreases from 210 MHz to 180 MHz, and the frequency step size $S_3$ of the fine tuning code FTW_T decreases from 10 MHz to 6 MHz. As a result, the output frequency CKV(f) drops from 1000 MHz to 840 MHz. In response, the ADPLL 100 increases the oscillator tuning code OTW to attempt to restore the output frequency CKV(f) to 1000 MHz.

Refer to the diagram 404. At time $t_{42}$, the increase in the oscillator tuning code OTW causes the fine tuning code FTW to increase to 20, which corresponds to the upper bound of the frequency covering range. Refer to the diagram 406. Subsequently, at time $t_{43}$, when the ADPLL 100 further attempts to increase the oscillator tuning code OTW, the overflow detect signal OF_F is asserted by the overflow/underflow detector of fine tuning code 152 in FIG. 9. Refer to the diagram 402. At time $t_{44}$, upon arrival of an active edge of the frequency divided signal FDIV (not shown in FIG. 12), the coarse tuning code adjustor 162 increases the coarse tuning code CTW_OUT from 4 to 5 in response to the asserted overflow detect signal OF_F. By increasing the coarse tuning code CTW_OUT to 5, the output frequency CKV(f) reaches 1020 MHz. Refer to the diagrams 404 and 406. Therefore, at time $t_{45}$, when the next active edge of the reference signal FREF arrives, the fine tuning code FTW is decreased and the overflow detect signal OF_F is deasserted. The fine tuning code FTW is further decreased until the output frequency CKV(f) is settled at 1 GHz.

In some approaches, because the ADPLL is discrete in tuning the output frequency CKV(f), the frequency covering range of the fine tuning stage is around 10 times the frequency step size of the coarse tuning stage. To account for PVT variations, the frequency covering range of the fine tuning stage may need to be more than 10 times the frequency step size of the coarse tuning stage. Compared to the ADPLL in some approaches, the frequency covering range of the fine tuning stage of the ADPLL 100 (shown in FIG. 5) is only less than 2 times the frequency step size $S_2$ of the coarse tuning stage due to automatic across-stage adjustment during the fine tuning stage. Therefore, the power and area of the ADPLL 100 is significantly lower than those of the ADPLL in some approaches.

Figure 13:
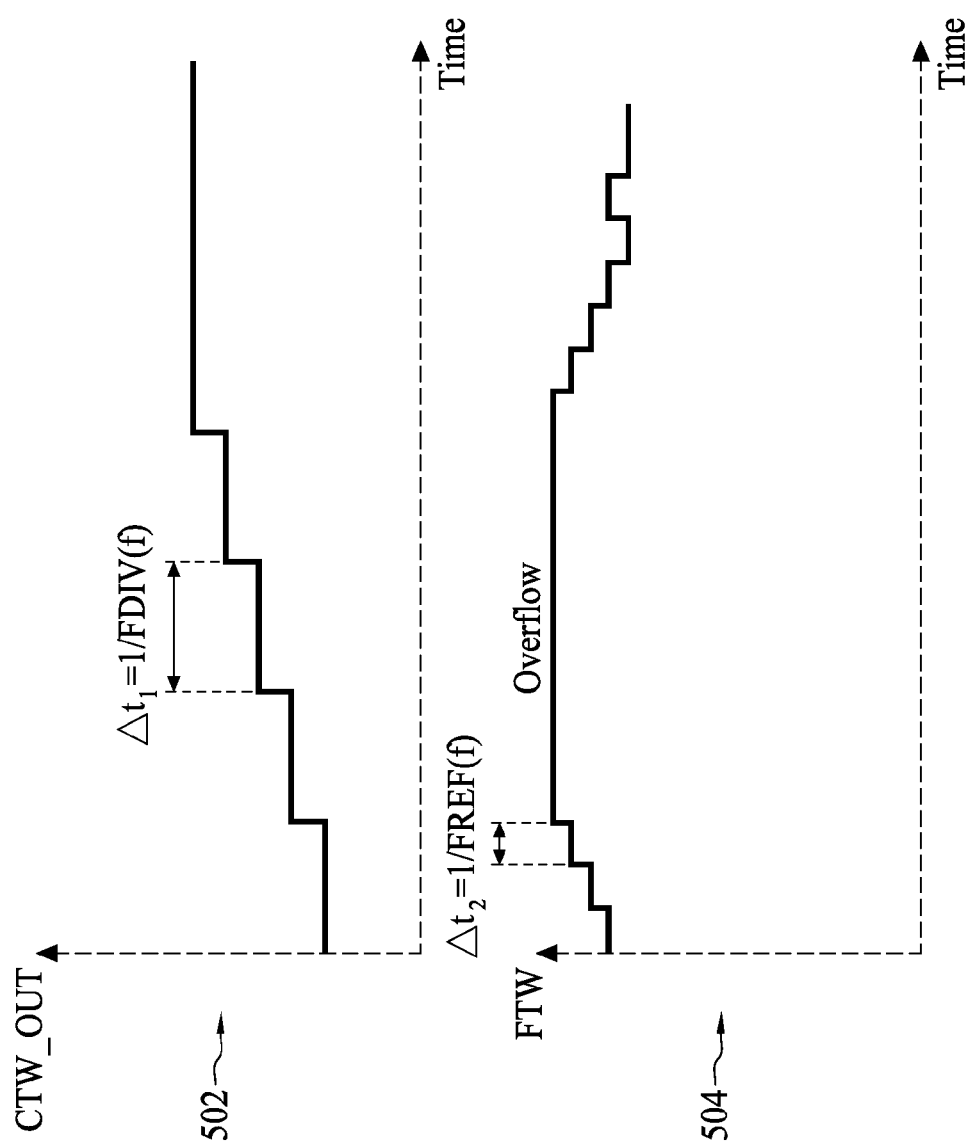
FIG. 13 is a diagram including schematic timing diagrams of the adjusted coarse tuning code and the fine tuning code, respectively, for illustrating a constraint on the frequency of the frequency divided signal in accordance with some embodiments.

FIG. 13 is a diagram including schematic timing diagrams 502 and 504 of the adjusted coarse tuning code CTW_OUT and the fine tuning code FTW, respectively, for illustrating a constraint on the frequency FDIV(f) of the frequency divided signal FDIV in accordance with some embodiments. In some embodiments, the frequency FDIV(f) is less than a bandwidth of the ADPLL 100 (shown in FIG. 5). In some embodiments, the effect of adjusting the coarse tuning code CTW_OUT will be filtered out by the ADPLL 100 if a period $\Delta t_1$ of adjustment which is equal to the inverse of the frequency FDIV(f) is too short. In some embodiments, the frequency FDIV(f) is less than half the bandwidth of the ADPLL 100. For example, when the reference frequency FREF(f) of the ADPLL 100 is 100 MHz, and the bandwidth of the ADPLL 100 is 10 MHz, the frequency FDIV(f) is set to be less than 5 MHz. As a result, the period $\Delta t_1$ at which the coarse tuning code CTW_OUT is adjusted is more than 20 times a period $\Delta t_2$ at which the fine tuning code FTW is updated.

Figure 14:
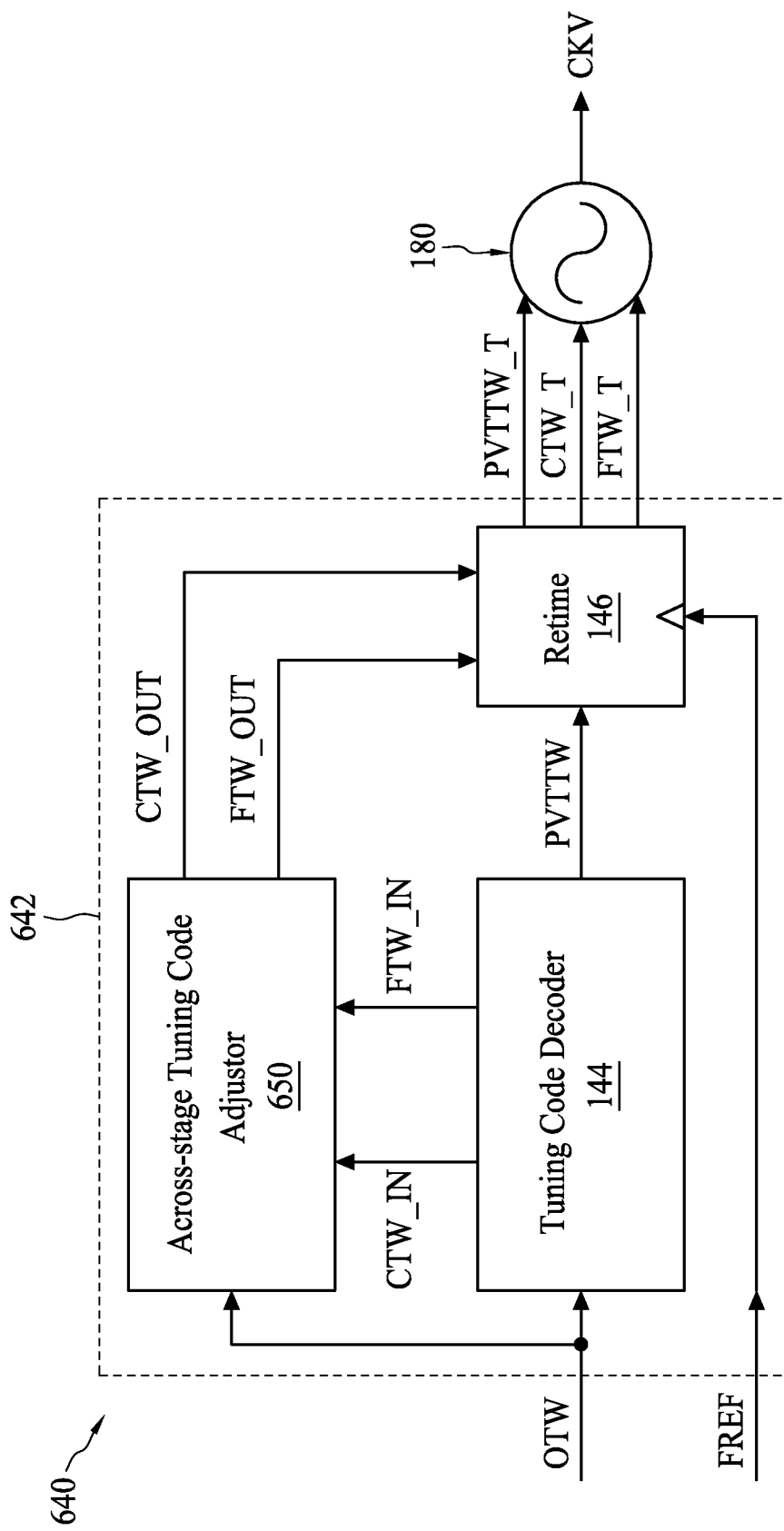
FIG. 14 is a schematic block diagram of an across-stage controlled DCO in accordance with other embodiments.

FIG. 14 is a schematic block diagram of an across-stage controlled DCO 640 in accordance with other embodiments. Compared to the across-stage controlled DCO 140 in FIG. 7, the across-stage controlled DCO 640 includes an across-stage tuning code adjustor 650 which further receives a fine tuning code FTW_IN from the tuning code decoder 144 and further generates a fine tuning code FTW_OUT. In some embodiments, the across-stage tuning code adjustor 650 performs overflow and underflow detection on the oscillator tuning code OTW, and adjusts both the received coarse tuning code CTW_IN and the fine tuning code FTW_IN, if overflow or underflow is detected, to generate the coarse tuning code CTW_OUT and the fine tuning code FTW_OUT.

Figure 15:
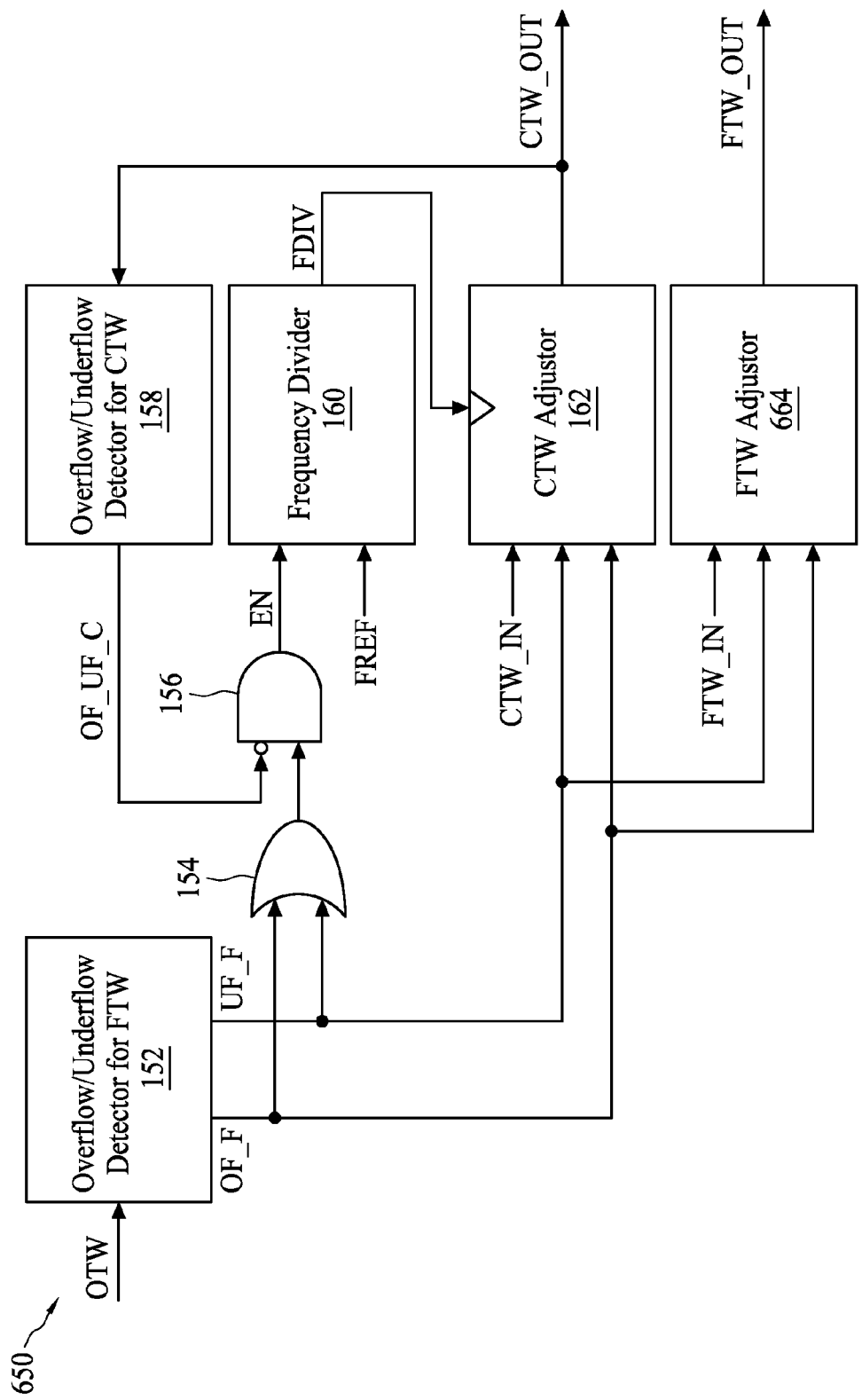
FIG. 15 is a schematic block diagram of the across-stage tuning code adjustor in FIG. 14 in accordance with other embodiments.

FIG. 15 is a schematic block diagram of the across-stage tuning code adjustor 650 in FIG. 14 in accordance with other embodiments. Compared to the across-stage tuning code adjustor 150 in FIG. 9, the across-stage tuning code adjustor 650 further includes a fine tuning code compensator 664. The fine tuning code compensator 664 receives the fine tuning code FTW_IN, the overflow detect signal OF_F and the underflow detect signal UF_F, and generates the adjusted fine tuning code FTW_OUT that compensates for an abrupt change in the output frequency CKV(f) due to the adjusted coarse tuning code CTW_OUT.

Figure 16:
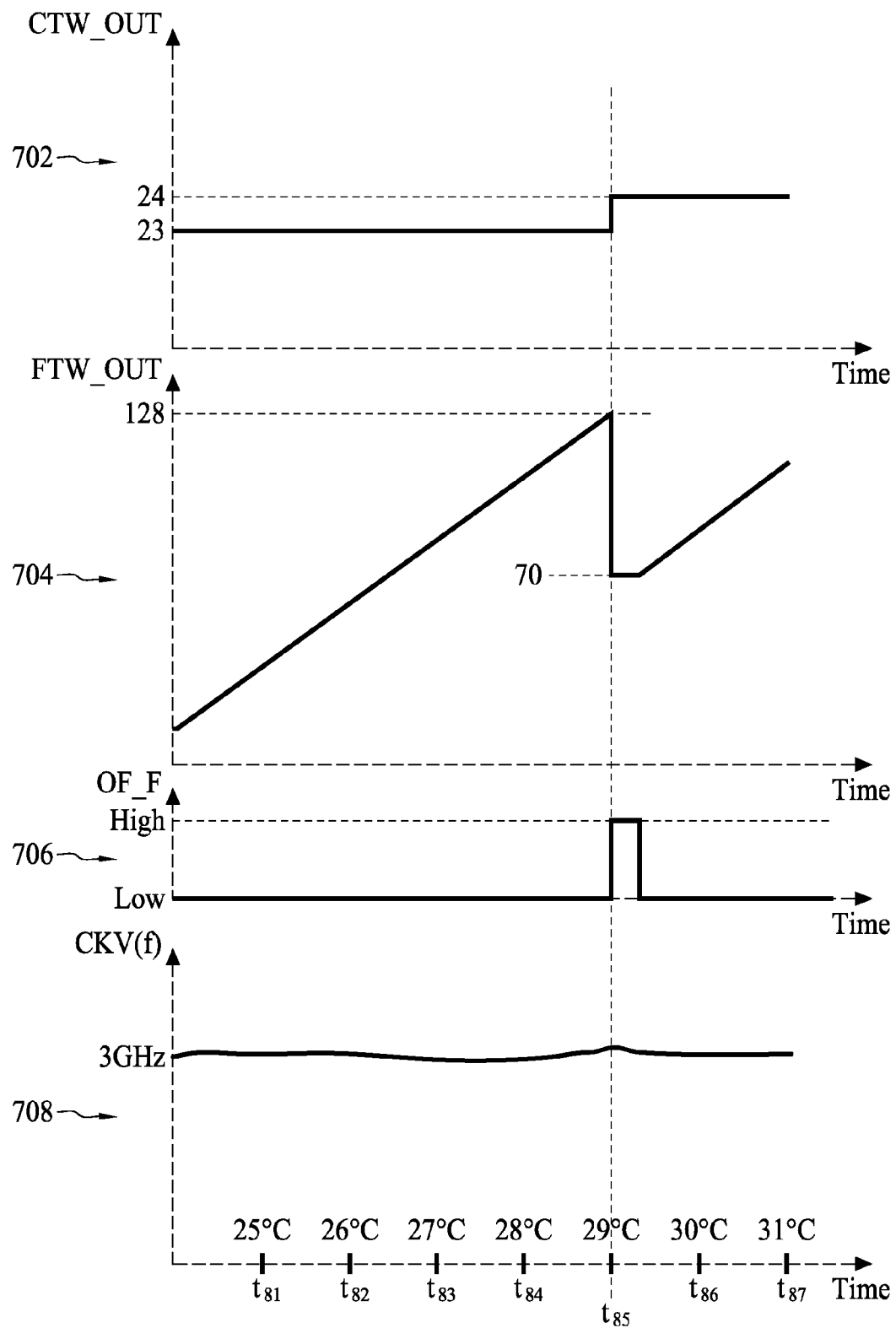
FIG. 16 is a diagram including schematic timing diagrams of the adjusted coarse tuning code, the adjusted fine tuning code, the overflow detect signal and the output frequency, respectively, during the fine tuning stage in accordance with some embodiments.

FIG. 16 is a diagram including schematic timing diagrams 702, 704, 706 and 708 of the adjusted coarse tuning code CTW_OUT, the adjusted fine tuning code FTW_OUT, the overflow detect signal OF_F and the output frequency CKV (f), respectively, in accordance with some embodiments. Referring to the timing diagram 708, suppose the ADPLL 100 (shown in FIG. 5) has settled at 3 GHz in the fine tuning stage. Then, as time progresses from $t_{81}$ to $t_{87}$, the environment temperature correspondingly increases from 25° C. to 31° C. As described with FIG. 12, when the temperature increases, the frequency step sizes $S_2$ and $S_3$ decreases. Referring to the timing diagram 704, the oscillator tuning code OTW and hence the fine tuning code FTW_OUT increases to attempt to stabilize the output frequency CKV(f) until around time $t_{85}$. At around time $t_{85}$, the oscillator tuning code OTW has reached 128, which corresponds to an upper bound of the frequency covering range of the fine tuning stage. At time $t_{85}$, a further attempt to increase the oscillator tuning code OTW causes the overflow detect signal OF_F to assert. Refer to the timing diagram 702. In response to the asserted overflow detect signal OF_F, the coarse tuning code CTW_OUT increases from 23 to 24. Such an increases in the coarse tuning code CTW_OUT translates into a frequency jump of, for example, 210 MHz. Refer to the timing diagrams 704 and 708. In order to maintain the output frequency CKV(f) substantially at 3 GHz, at time $t_{85}$, in response to the assertion of the overflow detect signal OF_F, the fine tuning code adjustor 664 in FIG. 15 generates the fine tuning code FTW_OUT which is decreased from 128 to 70 to compensate for the abrupt jump of frequency caused by the adjustment in the coarse tuning code CTW_OUT. Therefore, the output frequency CKV(f) is maintained substantially at 3 GHz.

Figure 17:
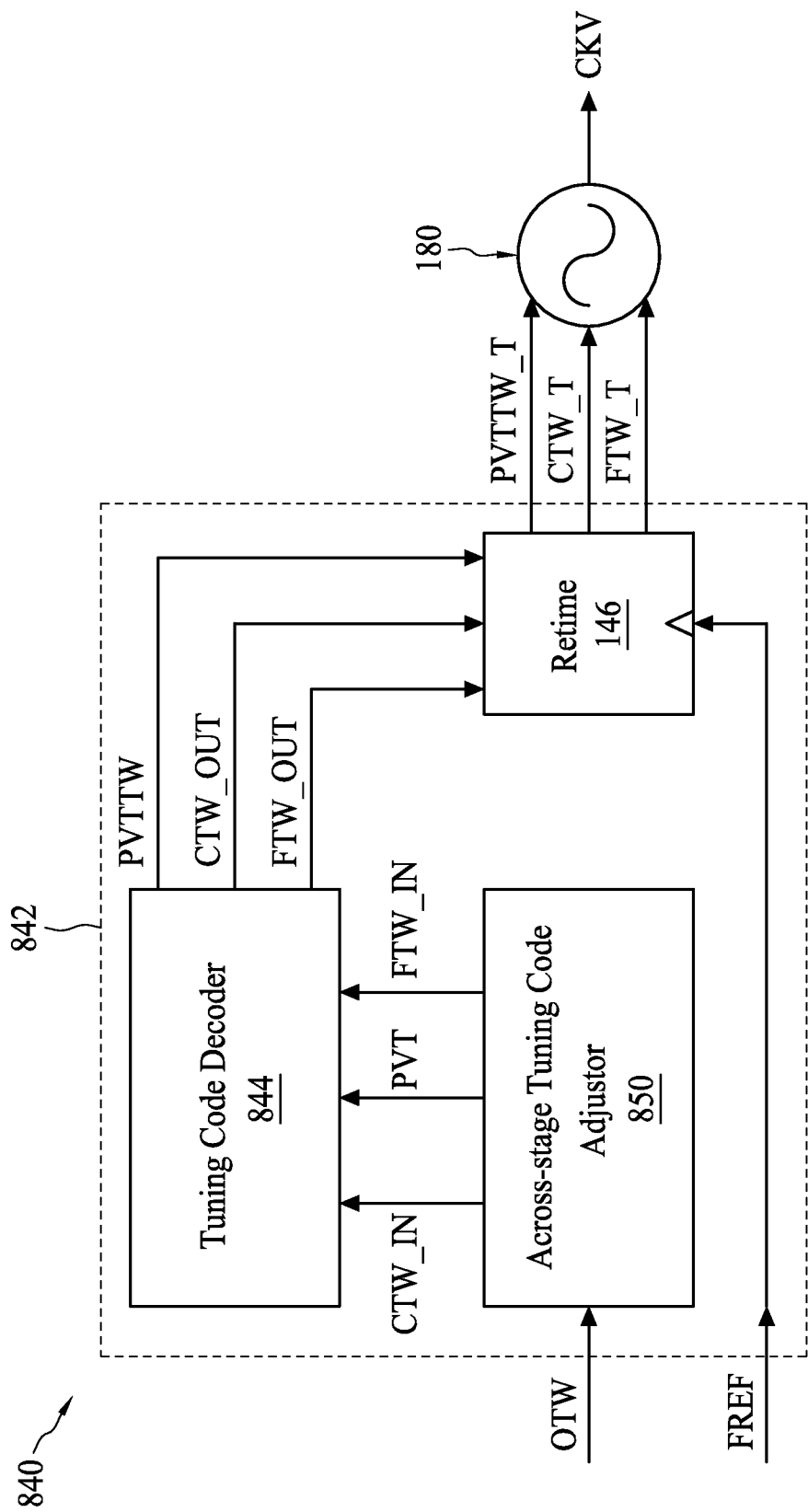
FIG. 17 is a schematic block diagram of an across-stage controlled DCO in accordance with some embodiments.

FIG. 17 is a schematic block diagram of an across-stage controlled DCO 840 in accordance with some embodiments. Compared to the across-stage controlled DCO 140 in FIG. 7, the across-stage controlled DCO 840 includes an across-stage tuning code adjustor 850 which provides binary-coded PVT tuning code PVT, coarse tuning code CTW_IN and fine tuning code FTW_IN to a tuning code decoder 844. The coarse tuning code CTW_IN and the fine tuning code FTW_IN have been adjusted if overflow or underflow is detected in the oscillator tuning code OTW. The across-stage controlled DCO 840 further includes the tuning code decoder 844 which receive the binary-coded PVT tuning code PVT, coarse tuning code CTW_IN and the tuning code FTW_IN and translate them into thermometer-coded PVT tuning code PVTTW, coarse tuning code CTW_OUT and fine tuning code FTW_OUT. Then, the tuning code decoder 844 provides the recorded PVT tuning code PVTTW, the coarse tuning code CTW_OUT and the fine tuning code FTW_OUT to the retime elements 146.

Figure 18:
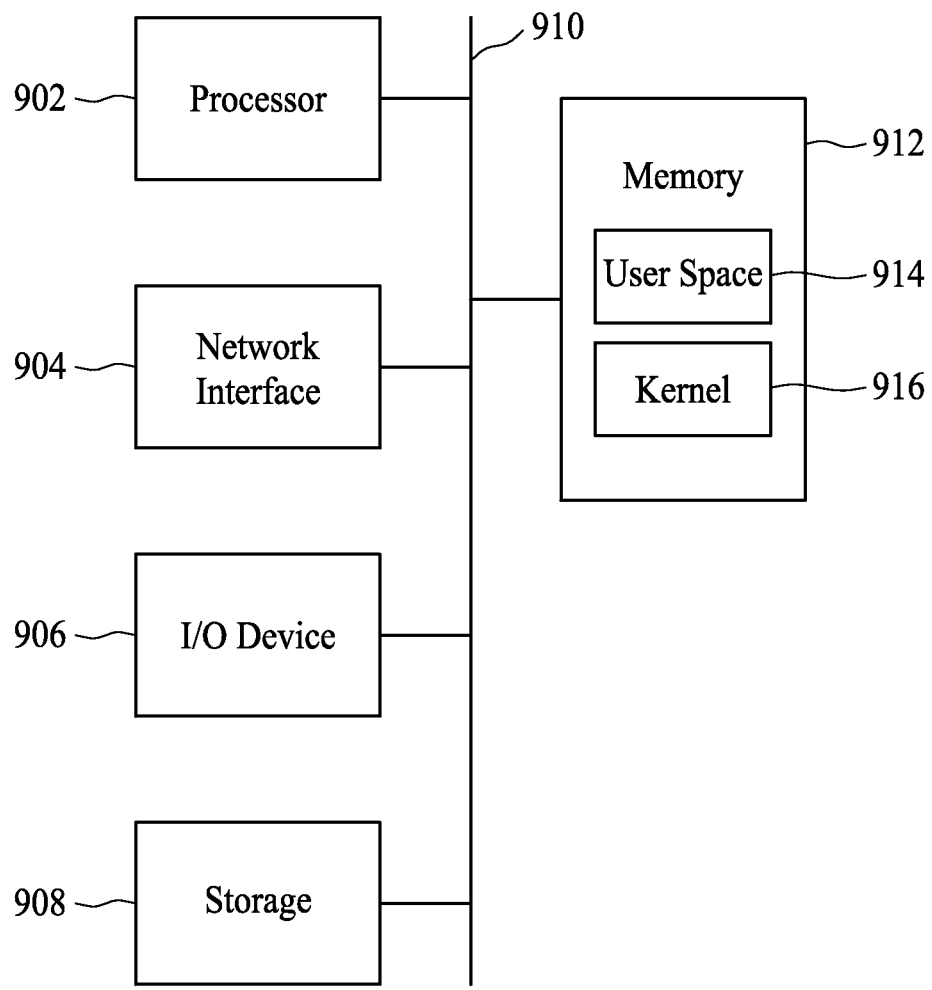
FIG. 18 is a block diagram of a hardware system for implementing the method embodiment described with reference to FIG. 11 in accordance with some embodiments.

FIG. 18 is a block diagram of a hardware system 900 for implementing the method embodiment described with reference to FIG. 11 in accordance with some embodiments. The system 900 includes at least one processor 902, a network interface 904, an input and output (I/O) device 906, a storage 908, a memory 912, and a bus 910. The bus 910 couples the network interface 904, the I/O device 906, the storage 908 and the memory 912 to the processor 902.

In some embodiments, the memory 912 comprises a random access memory (RAM) and/or other volatile storage device and/or read only memory (ROM) and/or other non-volatile storage device. The memory 912 includes a kernel 916 and user space 914, configured to store program instructions to be executed by the processor 902 and data accessed by the program instructions.

In some embodiments, the network interface 904 is configured to access program instructions and data accessed by the program instructions stored remotely through a network. The I/O device 906 includes an input device and an output device configured for enabling user interaction with the system 900. The input device comprises, for example, a keyboard, a mouse, etc. The output device comprises, for example, a display, a printer, etc. The storage device 908 is configured for storing program instructions and data accessed by the program instructions. The storage device 908 comprises, for example, a magnetic disk and an optical disk.

In some embodiments, when executing the program instructions, the processor 902 is configured to perform the method described with reference to FIG. 11.

In some embodiments, the program instructions are stored in a non-transitory computer readable recording medium 78 in FIG. 4 such as one or more optical disks, hard disks and non-volatile memory devices.

Some embodiments have one or a combination of the following features and/or advantages. In some embodiments, a PLL includes a DCO controlled by an across-stage DCO controller. The across-stage DCO controller detects if an oscillator tuning code OTW in a current stage in which an output frequency of a DCO is tuned by a first step size overflows or underflows, and adjust a tuning code obtained in a previous stage in which the output frequency is tuned by a second step size if the oscillator tuning code OTW overflows or underflows. The second step size is larger than the first step size. Compared to other approaches which need a frequency covering range of the current stage to be around 10 times of the second step size for a discrete PLL to operate well and even more than 10 times to account for PVT variations, the across-stage adjustment of the tuning code from the previous stage during the current stage significantly reduces the frequency covering range of the current stage. In some embodiments, the frequency covering range of the current stage is less than 2 times the second step size. Furthermore, the across-stage DCO controller further adjusts a tuning code translated from the oscillator tuning code OTW to compensate for the abrupt change in the output frequency due to the across-stage adjustment in the tuning code from the previous stage. Therefore, the output frequency is maintained substantially constant.

In some embodiments, a phase lock loop (PLL) comprises an across-stage digital controlled oscillator (DCO) controller and a DCO. The across-stage DCO controller comprises a first detector and a second tuning code adjustor. The first detector is configured to receive a first tuning code in a current stage in which an output frequency of the DCO is tuned by a first step size and generate a first detect signal which indicates whether the first tuning code exceeds a first range that the DCO can be correspondingly tuned in the current stage. The second tuning code adjustor is configured to adjust a second tuning code from a previous stage from which the output frequency of the DCO is tuned by a second step size in response to the first detect signal. The second step size is larger than the first step size. The DCO is configured to generate the output frequency in response to codes comprising the adjusted second tuning code from the across-stage DCO controller.

In some embodiments, a phase lock loop (PLL) comprises a first detector, a second tuning code adjustor and a DCO. The first detector is configured to receive a first tuning code which controls an output frequency of a DCO to be tuned by a first step size and generate a first detect signal which indicates whether the first tuning code exceeds a first range that the first tuning code is allowed to tune the output frequency. The second tuning code adjustor is configured to adjust the second tuning code which controls the output frequency of the DCO to be tuned by a second step size. The second tuning code is adjusted in response to the first detect signal. The second step size is larger than the first step size. The DCO is configured to generate the output frequency in response to codes comprising the adjusted second tuning code.

In some embodiments, in a method, a first tuning code in a current stage in which an output frequency is tuned by a first step size is received. Whether the first tuning code exceeds a first range that the output frequency can be correspondingly tuned in the current stage is detected. A second tuning code from a previous stage from which the output frequency is tuned by a second step size is adjusted if the first tuning code exceeds a first range that the output frequency can be correspondingly tuned in the current stage. The second step size is larger than the first step size. The output frequency is generated in response to codes comprising the adjusted second tuning code.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A phase lock loop (PLL), comprising:
an across-stage digital controlled oscillator (DCO) controller comprising:
a first detector configured to receive a first tuning code in a current stage in which an output frequency of a DCO is tuned by a first step size and generate a first detect signal which indicates whether the first tuning code exceeds a first range that the DCO can be correspondingly tuned in the current stage; and
a second tuning code adjustor configured to adjust a second tuning code from a previous stage from which the output frequency of the DCO is tuned by a second step size in response to the first detect signal, the second step size being larger than the first step size; and the DCO configured to generate the output frequency in response to codes comprising the adjusted second tuning code from the across-stage DCO controller.

2. The PLL of claim 1, wherein the across-stage DCO controller further comprises:
a decoder configured to cause the codes to be thermometer-coded.

3. The PLL of claim 2, wherein the second tuning code adjustor receives the second tuning code which is thermometer-coded and adjust the thermometer-coded second tuning code.

4. The PLL of claim 3, wherein the first detector receives the first tuning code which is binary-coded and generate the first detect signal based on the binary-coded first tuning code.

5. The PLL of claim 1, wherein the across-stage DCO controller further comprises:
a first tuning code compensator configured to adjust the first tuning code such that the output frequency of the DCO is correspondingly compensated when the second tuning code is adjusted.

6. The PLL of claim 1, wherein the across-stage DCO controller further comprises:
a second detector configured to receive the adjusted second tuning code and generate a second detect signal which indicates whether the adjusted second tuning code has reached a bound of a second range that the DCO can be tuned in the previous stage; and
the second tuning code adjustor is further configured to be stopped from adjusting the second tuning code when the second detect signal is asserted.

7. The PLL of claim 6, wherein the across-stage DCO controller further comprises:
a frequency divider configured to divide a reference frequency to generate a frequency divided signal that the second tuning code adjustor is operated under;
the reference frequency is tracked by the output frequency of the DCO; and
the frequency divided signal is stopped when the second detect signal indicates the adjusted second tuning code has reached the bound of the second range.

8. The PLL of claim 6, wherein the second detector consisting essentially of a comparator that operates on unsigned numbers.

9. The PLL of claim 1, wherein the across-stage DCO controller further comprises:
a frequency divider configured to divide a reference frequency to generate a frequency divided signal that the second tuning code adjustor is operated under;
the reference frequency is tracked by the output frequency of the DCO; and
a frequency of the frequency divided signal is less than half a bandwidth of the PLL.

10. The PLL of claim 9, wherein the second tuning code adjustor comprises:
an adjustment selector configured to select one of an increment, a decrement and zero as an adjustment in response to the first detect signal;
an adjustment accumulator configured to accumulate the adjustment in response to the frequency divided signal; and
a summing element configured add the accumulated adjustment from the accumulator to adjust the second tuning code.

11. A phase lock loop (PLL) comprising:
a first detector configured to receive a first tuning code which controls an output frequency of a DCO to be tuned by a first step size and generate a first detect signal which indicates whether the first tuning code exceeds a first range that the first tuning code is allowed to tune the output frequency;
a second tuning code adjustor configured to adjust the second tuning code which controls the output frequency of the DCO to be tuned by a second step size,
the second tuning code being adjusted in response to the first detect signal, and
the second step size being larger than the first step size; and
the DCO configured to generate the output frequency in response to codes comprising the adjusted second tuning code.

12. The PLL of claim 11, further comprising:
a decoder configured to cause the codes to be thermometer-coded.

13. The PLL of claim 12, wherein the second tuning code adjustor receives the second tuning code which is thermometer-coded and adjust the thermometer-coded second tuning code.

14. The PLL of claim 13, wherein the first detector receives the first tuning code which is binary-coded and generate the first detect signal based on the binary-coded first tuning code.

15. The PLL of claim 11, further comprising:
a first tuning code compensator configured to adjust the first tuning code such that the output frequency of the DCO is correspondingly compensated when the second tuning code is adjusted.

16. The PLL of claim 11, further comprising:
a second detector configured to receive the adjusted second tuning code and generate a second detect signal which indicates whether the adjusted second tuning code has reached a bound of a second range that the second tuning code is allowed to tune the output frequency;
the second tuning code adjustor is further configured to be stopped from adjusting the second tuning code when the second detect signal is asserted.

17. The PLL of claim 16, further comprising:
a frequency divider configured to divide a reference frequency to generate a frequency divided signal that the second tuning code adjustor is operated under,
the reference frequency being tracked by the output frequency of the DCO, and
the frequency divided signal being stopped when the second detect signal indicates the adjusted second tuning code has reached the bound of the second range.

18. The PLL of claim 11, further comprising:
a frequency divider configured to divide a reference frequency to generate a frequency divided signal that the second tuning code adjustor is operated under,
the reference frequency being tracked by the output frequency of the DCO, and
a frequency of the divided clock being less than half a bandwidth of the PLL.

19. The PLL of claim 18, wherein the second tuning code adjustor comprises:
an adjustment selector configured to select one of an increment, a decrement and zero as an adjustment in response to the first detect signal;
an adjustment accumulator configured to accumulate the adjustment in response to the frequency divided clock; and
an adder configured to add the accumulated adjustment from the accumulator to adjust the second tuning code.

20. A method, comprising:
receiving, by at least one processor, a first tuning code in a current stage in which an output frequency is tuned by a first step size;
detecting, by the at least one processor, whether the first tuning code exceeds a first range that the output frequency can be correspondingly tuned in the current stage;
adjusting a second tuning code, by the at least one processor, from a previous stage in which the output frequency is tuned by a second step size if the first tuning code exceeds a first range that the output frequency can be correspondingly tuned in the current stage,
the second step size being larger than the first step size.
generating the output frequency in response to codes comprising the adjusted second tuning code.

* * * * *